United States Patent
Vawter

(10) Patent No.: US 7,787,719 B1
(45) Date of Patent: Aug. 31, 2010

(54) OPTICAL DATA LATCH

(75) Inventor: G. Allen Vawter, Corrales, NM (US)

(73) Assignee: Sardia Corporation, Albuquerque, NM (US)

(*) Notice: Subject to any disclaimer, the term of this patent is extended or adjusted under 35 U.S.C. 154(b) by 0 days.

(21) Appl. No.: 12/558,025

(22) Filed: Sep. 11, 2009

(51) Int. Cl.
    *G02B 6/12* (2006.01)
(52) U.S. Cl. .......................... 385/14; 385/24; 385/123
(58) Field of Classification Search .............. 385/14, 385/24, 123
    See application file for complete search history.

(56) References Cited

U.S. PATENT DOCUMENTS

| 5,625,729 | A | * | 4/1997 | Brown | 385/31 |
| 7,738,522 | B2 | * | 6/2010 | Henrichs | 372/43.01 |

OTHER PUBLICATIONS

S. Kodama et al., "2.3 picoseconds optical gate monolithically integrating photodiode and electroabsorption modulator", Electronics Letters, Sep. 13, 2001, vol. 37, No. 19, pp. 1185-1186.
S. Kodama et al., "500 Gbit/s optical gate monolithically integrating photodiode and electroabsorption modulator", Electronics Letters, Apr. 29, 2004, vol. 40, No. 9.
Erik J. Skogen et al., "Monolithically Integrated Active Components: A Quantum-Well Intermixing Approach", IEEE Journal of Selected Topics in Quantum Electronics, vol. 11, No. 2, Mar./Apr. 2005, pp. 343-355.
Toshihide Yoshimatsu, et al, "100 Gb/s Error-Free Wavelength Conversion With a Monolithic Optical Gate Integrating a Photodiode and Electroabsorption Modulator", IEEE Photonics Technology Letters, vol. 17, No. 11, Nov. 2005, pp. 2367-2369.
James W. Raring, et al, "Design and Demonstration of Novel QW Intermixing Scheme for the Integration of UTC-Type Photodiodes with QW-Based Components", IEEE Journal of Quantum Electronics, vol. 42, No. 2, Feb. 2006, pp. 171-181.
James W. Raring, et al, "40-Gb/s Widely Tunable Transceivers", IEEE Journal of Selected Topics in Quantum Electronics, vol. 13, No. 1, Jan./Feb. 2007, pp. 3-14.

* cited by examiner

*Primary Examiner*—Jennifer Doan
(74) *Attorney, Agent, or Firm*—John P. Hohimer

(57) ABSTRACT

An optical data latch is formed on a substrate from a pair of optical logic gates in a cross-coupled arrangement in which optical waveguides are used to couple an output of each gate to an photodetector input of the other gate. This provides an optical bi-stability which can be used to store a bit of optical information in the latch. Each optical logic gate, which can be an optical NOT gate (i.e. an optical inverter) or an optical NOR gate, includes a waveguide photodetector electrically connected in series with a waveguide electroabsorption modulator. The optical data latch can be formed on a III-V compound semiconductor substrate (e.g. an InP or GaAs substrate) from III-V compound semiconductor layers. A number of optical data latches can be cascaded to form a clocked optical data shift register.

27 Claims, 13 Drawing Sheets

OPTICAL DATA LATCH

GOVERNMENT RIGHTS

This invention was made with Government support under Contract No. DE-AC04-94AL85000 awarded by the U.S. Department of Energy. The Government has certain rights in the invention.

CROSS REFERENCE TO RELATED APPLICATIONS

The present application is related to U.S. patent application Ser. No. 12/182,683, entitled "Optical NAND Gate," of common assignee filed on Jul. 30, 2008, the contents of which are incorporated herein by reference in their entirety. The present application is also related to U.S. patent application Ser. No. 12/270,221, entitled "Optical NOR Gate," of common assignee filed on Nov. 13, 2008, the contents of which are incorporated herein by reference in their entirety.

FIELD OF THE INVENTION

The present invention relates in general to digital optical logic, and in particular to a optical data latch which utilizes waveguide electroabsorption modulators and waveguide photodetectors to store optical information. The optical data latch can also be used to form a clocked optical data shift register.

BACKGROUND OF THE INVENTION

Optical logic gates have been the subject of research for several decades due to the possibility of achieving higher operating speeds than logic based on electronics. The advantages of digital signal processing in the optical domain include higher signal bandwidth, lower signal cross-talk, and greater protection against electronic eavesdropping. All-optical signal processing also eliminates the need to convert signals from the optical domain into the electronic domain for processing using electronic signal processing circuitry, and then to re-convert the processed signals from the electronic domain back into the optical domain. All-optical signal processing is advantageous to reduce the cost, electrical power requirement, size and weight compared to optical-to-electronic converters, electronic signal processing circuitry, and electronic-to-optical converters which are currently being used.

In the development of optical signal processing, there is a need for optical memory to store the optical information being processed. Prior digital optical logic gates have been incapable of storing the optical information being processed and thus have operated asynchronously. Such asynchronous operation is undesirable since it does not allow the transfer of the optical information from one optical logic gate to another using an optical clock pulse.

The present invention addresses this need by providing an optical data latch that can be used to store a bit of optical information in digital optical form. The optical data latch of the present invention can also be used to form a clocked optical data shift register which operates synchronously to store many bits of optical information, and to read those bits of optical information into and out of the shift register using an optical clock.

The optical data latch of the present invention utilizes two optical logic gates in a cross-coupled arrangement to provide a bi-stable operation which can be used to optically store a logical "0" state or a logical "1" state in the latch. Each optical logic gate, which can be either an optical NOT gate (also termed an optical inverter) or an optical NOR gate, comprises a single waveguide electroabsorption modulator which is electrically connected in series with a waveguide photodetector. A resistor can also be connected in parallel with the waveguide electroabsorption modulator to increase the operating speed of the optical data latch. The optical data latch operates using optical input signals to set or reset an optical logic state (i.e. a bit of optical information) in the latch, and can also provide that optical logic state and its complement as optical output signals from the latch. Only direct current (dc) electrical power sources are required to operate the optical data latch, with these dc power sources being used to bias the waveguide photodetector and waveguide electroabsorption modulator, to operate one or more semiconductor lasers to generate light which is used to store the bit of optical information within the latch, and to operate optional semiconductor optical amplifiers which can be used to provide optical signal gain and regeneration in the latch.

These and other advantages of the present invention will become evident to those skilled in the art.

SUMMARY OF THE INVENTION

The present invention relates to an optical data latch which comprises a pair of optical logic gates, with each optical logic gate comprising a waveguide electroabsorption modulator which is electrically connected in series with a waveguide photodetector which has one or more photodetector inputs. Each optical logic gate has a modulator input wherein light is coupled into the waveguide electroabsorption modulator, with the light which is transmitted through the waveguide electroabsorption modulator forming an output for that optical logic gate. In the optical data latch, a plurality of optical waveguides are used to connect the pair of optical logic gates in a cross-coupled arrangement wherein the output of each optical logic gate of the pair of optical logic gates is optically connected to one of the photodetector inputs of the other optical logic gate of the pair of optical logic gates to couple the light therebetween and thereby bi-stably latch the optical data latch to store a bit of optical information therein. The plurality of optical waveguides include an input waveguide to couple an optical input signal (e.g. a Set or Reset signal) into each optical logic gate to set or reset the bit of optical information stored therein, and an output waveguide to couple the bit of optical information out of the optical data latch (e.g. as a Q or Q optical output signal). Each optical logic gate can comprise an optical inverter (also termed an optical NOT gate) or an optical NOR gate. A resistor can also be electrically connected in parallel with the waveguide electroabsorption modulator in some embodiments of the present invention to provide an increased operating speed.

The light coupled into the modulator input can be provided by a laser which emits light at a wavelength which is generally in the range of 0.8-2.0 microns. The laser can comprise a distributed Bragg reflector (DBR) laser.

The optical data latch can further comprise a semiconductor optical amplifier (SOA) to amplify the light which is coupled between the output of each optical logic gate in the pair of optical logic gates and one of the photodetector inputs of the other optical logic gate of the pair of optical logic gates. The pair of optical logic gates and the plurality of optical waveguides in the optical data latch can be formed on a III-V compound semiconductor substrate, with each waveguide photodetector and each waveguide electroabsorption modulator being formed from a plurality of III-V compound semiconductor layers which are epitaxially grown on the III-V compound semiconductor substrate. The optical waveguides can also be formed from the plurality of III-V compound semiconductor layers. As an example, the III-V compound semiconductor substrate can comprise indium phosphide (InP), and the plurality of III-V compound semiconductor layers can be selected from the group consisting of indium gallium arsenide phosphide (InGaAsP) layers, indium gallium arsenide (InGaAs) layers, indium aluminum gallium arsenide (InAlGaAs) layers, and combinations thereof. As another example, the III-V compound semiconductor substrate can comprise gallium arsenide (GaAs), and the plurality of III-V compound semiconductor layers can be selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

The present invention also relates to an optical data latch for storing a bit of optical information. The optical data latch comprises a pair of optical logic gates located on a III-V compound semiconductor substrate, with each optical logic gate comprising a combination of a waveguide electroabsorption modulator and a resistor which are electrically connected in parallel, and with a waveguide photodetector electrically connected in series with the combination of the waveguide electroabsorption modulator and the resistor. At least one semiconductor laser can be located on the III-V compound semiconductor substrate to provide light which is transmitted through the waveguide electroabsorption modulator of each optical logic gate, with the transmitted light being coupled into the waveguide photodetector of the other optical logic gate to latch the pair of optical logic gates and thereby store the bit of optical information therein. A plurality of optical waveguides can also be located on the III-V compound semiconductor substrate to couple the transmitted light from the waveguide electroabsorption modulator of each optical logic gate to the waveguide photodetector of the other optical logic gate, to couple optical input signals into the waveguide photodetectors of the pair of optical logic gates to set and reset the bit of optical information stored in the optical data latch, and to couple the bit of optical information out of the optical data latch. The pair of optical logic gates can be selected from the group consisting of optical NOT gates (i.e. optical inverters) and optical NOR gates.

Each semiconductor laser can comprise a distributed Bragg reflector (DBR) laser. The light provided by each semiconductor laser can have a wavelength, for example, in the range of 0.8-2.0 microns.

The optical data latch can comprise a plurality of semiconductor optical amplifiers (SOAs) which are located on the III-V compound semiconductor substrate and which are optically connected to the plurality of optical waveguides.

The III-V compound semiconductor substrate can comprise indium phosphide or gallium arsenide. Each waveguide photodetector and each waveguide electroabsorption modulator can comprise a plurality of III-V compound semiconductor layers which are epitaxially grown on the III-V compound semiconductor substrate. When the III-V compound semiconductor substrate comprises indium phosphide (InP), the plurality of III-V compound semiconductor layers can be selected from the group consisting of indium gallium arsenide phosphide (InGaAsP) layers, indium gallium arsenide (InGaAs) layers, indium aluminum gallium arsenide (InAlGaAs) layers, and combinations thereof. And, when the III-V compound semiconductor substrate comprises gallium arsenide (GaAs), the plurality of III-V compound semiconductor layers can be selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

The present invention further relates to an optical data latch which comprises a III-V compound semiconductor substrate having a plurality of III-V compound semiconductor layers epitaxially grown thereon. One or more semiconductor lasers (e.g. DBR lasers) can be formed from the plurality of III-V compound semiconductor layers, with each semiconductor laser generating light in a wavelength range of 0.8-2.0 microns. A pair of optical logic gates is formed from the plurality of III-V compound semiconductor layers, with each optical logic gate comprising a waveguide electroabsorption modulator which is electrically connected in series with a waveguide photodetector. The light, which is transmitted through the waveguide electroabsorption modulator in each optical logic gate, can provide an output for that optical logic gate. The output of each optical logic gate is coupled into the waveguide photodetector of the other optical logic gate of the pair of optical logic gates to latch the optical data latch and thereby store a bit of optical information in the optical data latch. This is possible since the waveguide photodetector, which is electrically connected in series with the waveguide electroabsorption modulator, controls the light which is transmitted through the waveguide electroabsorption modulator in that optical logic gate in response to the light received into that waveguide photodetector. The pair of optical logic gates can be selected from the group consisting of optical NOT gates (i.e. optical inverters) and optical NOR gates. In some embodiments of the present invention, a resistor can be electrically connected in parallel with the waveguide electroabsorption modulator to provide for higher speed operation of the optical data latch.

The coupling of the output of each optical logic gate to the waveguide photodetector of the other optical logic gate of the pair of optical logic gates can be provided by a plurality of optical waveguides which are formed from the plurality of III-V compound semiconductor layers. The plurality of optical waveguides can also include optical waveguides to couple an optical input signal into the waveguide photodetector of each optical logic gate to set or reset the bit of optical information stored in the optical data latch, and optical waveguides to couple the bit of optical information out of the optical data latch.

Each semiconductor laser can comprise a distributed Bragg reflector (DBR) laser. A semiconductor optical amplifier (SOA) can also be provided in the optical data latch to amplify the light coupled into each waveguide photodetector. Additional SOAs can be provided, as needed, to amplify each optical input signal and/or to amplify an optical output signal which is coupled out of the optical data latch and which contains the bit of optical information or a logical complement thereof.

In some embodiments of the present invention, the III-V compound semiconductor substrate can comprise indium phosphide (InP), with the plurality of III-V compound semiconductor layers being selected from the group consisting of indium gallium arsenide phosphide (InGaAsP) layers, indium gallium arsenide (InGaAs) layers, indium aluminum gallium arsenide (InAlGaAs) layers, and combinations thereof. In other embodiments of the present invention, the III-V compound semiconductor substrate can comprise gallium arsenide (GaAs), with the plurality of III-V compound semiconductor layers being selected from the group consisting of GaAs layers, aluminum gallium arsenide (AlGaAs)

layers, indium gallium arsenide phosphide (InGaAsP) layers, indium gallium arsenide (InGaAs) layers, and combinations thereof.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIGS. 5A-5G are taken along the section line 1-1 in FIG. 3; and FIG. 5H is taken along the section line 2-2 in FIG. 3.

DETAILED DESCRIPTION OF THE INVENTION

Figure 1:
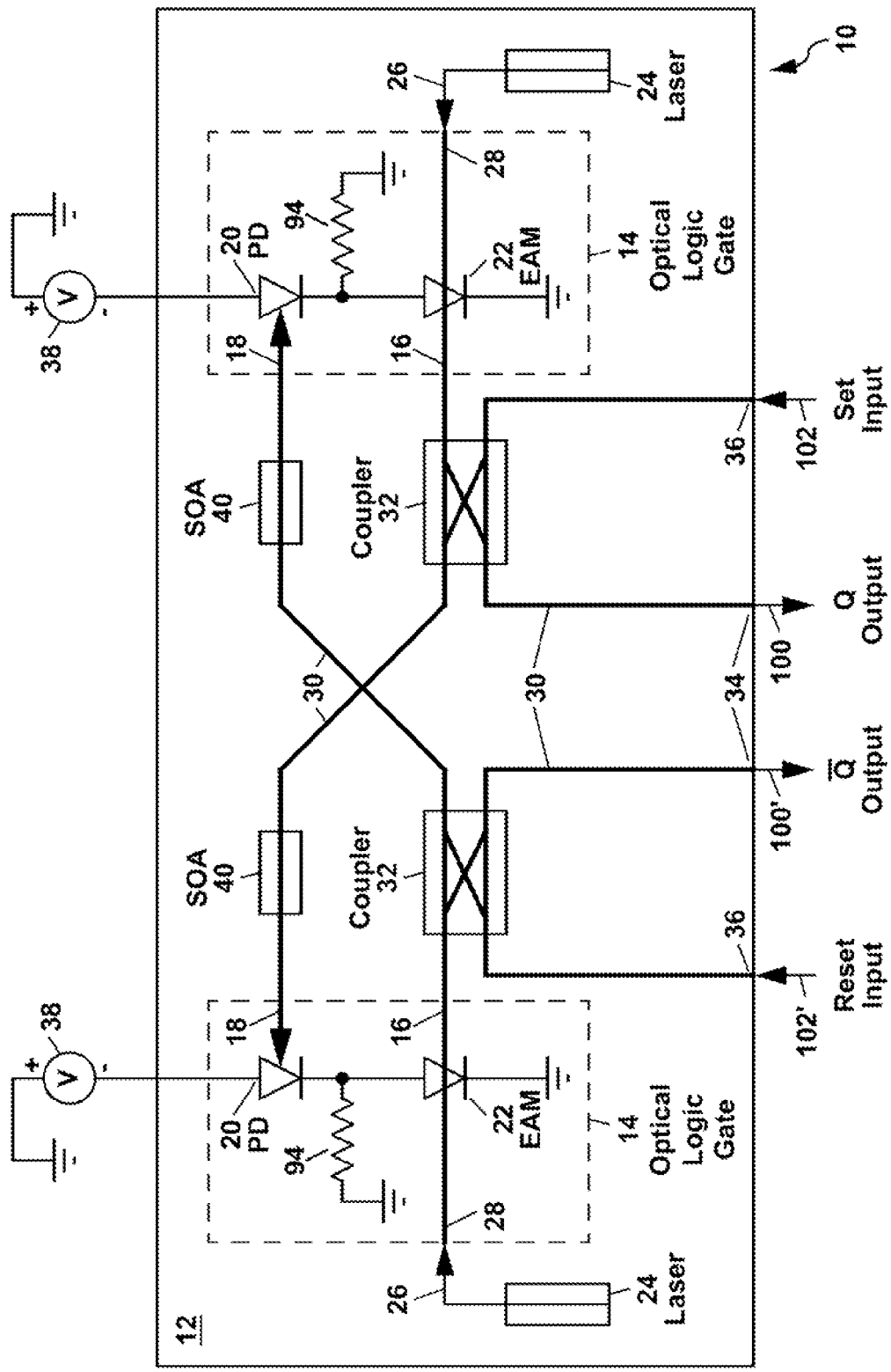
FIG. 1 shows a schematic diagram of a first example of the optical data latch of the present invention wherein the optical logic gates are optical NOT gates (i.e. optical inverters).

Referring to FIG. 1, there is shown a schematic diagram of a first example of the optical data latch 10 of the present invention which can be formed as a photonic integrated circuit (PIC). The optical data latch 10 comprises a substrate 12 on which are formed a pair of optical logic gates 14 which are connected in a cross-coupled arrangement whereby an output 16 of each optical logic gate 14 is optically connected to a photodetector input 18 of the other optical logic gate 14. This cross-coupled arrangement of the two optical logic gates 14 forms a bi-stable optical feedback loop which forces the outputs 16 of the pair of optical logic gates 14 to be exactly opposite of each other so that when one output 16 is bright (i.e. having a relatively high level of light which corresponds to a logical "1" state), then the other output 16 will be dark (i.e. having little or no light which corresponds to a logical "0" state). In this way, the optical data latch 10 can store a bit of optical information, and can also store a logical complement of that bit of optical information.

Each optical logic gate 14 comprises a waveguide photodetector (PD) 20 which is electrically connected in series with a waveguide electroabsorption modulator (EAM) 22, with a cathode side of the PD 20 being connected to an anode side of the EAM 22 as shown in FIG. 1. Each PD 20 and each EAM 22 can be formed either as a lumped-element device, or as a traveling-wave device. A resistor 94 (e.g. with a resistance of, for example, 25-50Ω) can be optionally connected in parallel with each EAM 22 as shown in FIG. 1. This is useful to increase an operating speed of the optical data latch 10.

In the example of FIG. 1, each optical logic gate 14 is an optical NOT gate (also termed an optical inverter). In other examples of the optical data latch 10 described herein, the optical logic gate 14 can be an optical NOR gate. The optical NOR gate can be formed similar to the optical NOT gate except that the PD 20 in the optical NOT gate receives two different light signals. This can be done, for example, by providing an additional photodetector input 18 into the PD 20 as will be described in detail hereinafter, or alternately by combining the two different light signals prior to coupling these light signals into a single photodetector input 18 for the PD 20.

In the example of FIG. 1 one or more lasers 24 can be located on the same substrate 12 as the optical logic gates 14 to provide light 26 for operation of the optical data latch 10. The laser light 26, which is coupled into a modulator input 28 of the EAM 22, can be continuous light (also termed continuous lasing emission or cw emission) and can have a wavelength in the range of 0.8-2.0 µm (microns). When the laser 24 is formed on the substrate 12 the light 26 can be coupled from the laser 24 into the EAM 22 using an optical waveguide 30. Additional optical waveguides 30 can be used to couple the output 16 of each optical logic gate 14 to the photodetector input 18 of the other optical logic gate 14, and to couple optical signals into and out of the latch 10.

An optical bi-stability occurs in the optical data latch since the light 26 in the optical waveguides 30 connecting the output 16 of each optical logic gate 14 to the photodetector input 18 of the other optical logic gate 14 must have opposite optical states since the output of each gate 14 is inverted from the photodetector input 18 for that gate 14. Thus when the light 26 in one of the optical waveguides 30 connecting the output 16 of one optical logic gate 14 to the photodetector input 18 of the other optical logic gate 14 is dark (i.e. at a relatively low light level due to a low transmission of the light 26 through the EAM 22 in that gate 14), then the light 26 in the other optical waveguide 30 must be bright (i.e. at a relatively high light level of up to a few milliWatts due to a high transmission of the light 26 through the EAM 22 in that gate 14), and vice versa.

In the example of FIG. 1, a pair of optical couplers 32 are provided to couple a portion of the light 26 from each output 16 out of the optical data latch 10, with that portion of the light 26 being routed through additional optical waveguides 30 to output ports 34 which are located at an edge of the substrate 12 to form an optical output signal (also termed a Q or $\overline{Q}$ output) for the latch 10. The Q and $\overline{Q}$ outputs 100 and 100', respectively, for the latch 10 are complementary so that when the Q output is in a logical "1" state characterized by a relatively high light level, the $\overline{Q}$ output will be in a logical "0" state characterized by a relatively low light level, and vice versa. The Q and $\overline{Q}$ outputs 100 and 100' in FIG. 1 can be coupled into optical fibers (not shown). In other embodiments of the present invention wherein a plurality of optical data latches 10 are located on a common substrate 12, the Q and $\overline{Q}$ outputs 100 and 100', respectively, can be coupled into optical waveguides 30 which are used to transmit these optical output signals to other optical data latches 10 and/or other optical logic gates (see FIGS. 6 and 8).

The optical couplers 32 can be formed using branching waveguide Y-junctions as shown in FIG. 1, or as multimode interference couplers (also termed MMI couplers). Both types of optical couplers 32 are well known in the art and need not be described in detail herein.

Optical Set and Reset input signals 102 and 102', respectively, can also be coupled into the optical data latch 10 of FIG. 1 at a pair of input ports 36 and coupled therefrom through the optical couplers 32 to the photodetector inputs 18. The Set input 102 (also termed an S input) and the Reset input 102' (also termed an R input), are used to set or reset the logic state of the bit of optical information which is stored within the optical data latch 10.

When the Set input 102, which can be a digital pulse of light in a logical "1" state characterized by a relatively high light level of up to a few milliWatts or more, is provided, the light in the Set input 102 will be coupled through the optical coupler 32 and into the photodetector input 18 for the optical logic gate 14 located on the left-hand side of FIG. 1. If this photodetector input 18 had been dark (i.e. in a logical "0" state) prior to receiving the Set input 102, then the light in the Set input 102 will be detected by the PD 20 on the left-hand side of FIG. 1; and an electrical photocurrent will be generated in this PD 20. The photocurrent will flow through the parallel-connected EAM 22 and resistor 94 on the left-hand side of FIG. 1 and will increase the amount of a reverse-bias voltage from a dc power supply 38 which is applied across the EAM 22. The increased reverse-bias voltage on the EAM 22 will increase the absorption of the light 26 from the laser 24 in this EAM 22 on the left-hand side of FIG. 1. This increased absorption of the light 26 will result in a relatively low level of the light 26 at the output 16 of the EAM 22 on the left-hand side of FIG. 1 so that the light level reaching the PD 20 on the right-hand side of FIG. 1 will also be low (i.e. dark and in a logical "0" state). With a relatively low amount of the light 26 reaching the PD 20 on the right-hand side of FIG. 1, the photocurrent generated in this PD 20 will be small and there will be only a small reverse-bias voltage across the EAM 22 on the right-hand side of FIG. 1 so that the light 26 transmitted through this EAM 22 will remain relatively high (i.e. bright and in a logical "1" state) to maintain the latch 10 in this bi-stable state with the Q output being in the logical "1" state and with the $\overline{Q}$ output being in the logical "0" state. The optical data latch 10 will remain in this bi-stable state as long as electrical power is supplied to the lasers 24 to generate the light 26 and until such time as a digital light pulse in a logical "1" state is input into the Reset input 102' of the optical data latch 10 to switch the latch 10 to an opposite bi-stable state with Q=0 and $\overline{Q}$=1.

Thus, providing a Set input 102 with a digital light pulse having a logical "1" state will switch the logic state stored within the latch 10 if the latch 10 had been in a state with Q=0 immediately prior to the Set input 102 in the logical "1" state so that the latch 10 will have Q=1 after the Set input 102. If the latch 10 had been in a logic state with Q=1 immediately prior to the Set input 102 in the logical "1" state, the latch 10 will be maintained in the Q=1 state after the Set input 102. This will also be the case if the Set 102 is in the logical "0" state (i.e. with no digital light pulse, or with a digital light pulse which is below a predetermined power level).

Similarly, providing a digital light pulse with a logical "1" state at the Reset input 102' will switch the bi-stable state of the latch 10 if the latch had been in a state with Q=1 immediately prior to the Reset input 102' so that the latch 10 will be switched to provide a Q=0 output 100 after the Reset input 102'. And, if the latch had been in a state with Q=0 immediately prior to the Reset input 102' having the logical "1" state, then the Reset input 102' will have no effect on the state of the latch 10 so that the latch 10 will remain in the Q=0 state. This will also be the case if the Reset input 102' is in the logical "0" state.

As described above, the bi-stable state of the latch 10 can be switched by providing an optical input signal at either the Set input 102 or the Reset input 102' depending upon the bi-stable state of the latch 10 immediately prior to the input of the optical input 102 or 102'. Switching of the bi-stable optical logic state of the latch 10 can occur at a very high rate of up to several tens of GigaHertz (GHz) or more.

By providing the resistor 94 in parallel with the EAM 22, the operating speed of the optical data latch 10 can be increased since the resistance of the resistor 94, which is generally about 25-50Ω, is much smaller than the impedance of the EAM 22 which can be from tens to thousands of Ohms when operating under reverse-bias conditions. Thus, the addition of the resistor 94 in parallel with the EAM 22 will reduce an RC time constant for each optical logic gate 14 and will thereby increase the operating speed of the optical data latch 10. For operation at a high speed of about 40 Gigabytes per second (Gb-s$^{-1}$), electrical connections between the PD 20, EAM 22 and resistor 94 can be made using radio-frequency (rf) transmission lines with low-loss rf by-pass capacitors (not shown).

In the example of FIG. 1, a semiconductor optical amplifier (SOA) 40 can be optionally provided in an optical path between each output 16 and each photodetector input 18. This is useful to provide optical signal gain and regeneration for the light 26 and for the Set and Reset inputs 102 and 102', respectively, and thereby increase the photocurrent generated in each PD 20. As an example, when the light 26 from the laser 24 is about 6 milliWatts (mW) at an input side of the optical coupler 32 in FIG. 1, the light 26 will generally be split into two substantially-equal portions so that 3 mW will be available at the photodetector input 18. By locating a SOA 40 in the optical waveguide 30 leading to the photodetector input 18, this 3 mW light level can be boosted up to, for example, 50 mW. This higher power level of the light 26 will generate a larger photocurrent in the PD 20 which will make it easier to maintain the logic state of the latch 10 in the absence of the Set or Reset input since the larger photocurrent will provide a larger contrast in the transmitted light 26 which forms the output 16 of each EAM 22. The SOA 40 is also useful to amplify the Set or Reset input 102 or 102', respectively, which will also be attenuated by a factor of two in passing through the optical coupler 32. Additional SOAs 40 can be optionally located in the optical waveguides 30 providing the Q and $\overline{Q}$ outputs 100 and 100'.

In the example of FIG. 1, the laser 24 can be a distributed Bragg reflector (DBR) laser 24 which is located on the substrate 12 as shown in FIG. 1. The DBR laser 24 can be forward-biased with a dc current source to generate the light 26 which can be continuous light due to continuous-wave (cw) lasing emission with an optical power level of, for example, 3-10 mW.

In other embodiments of the present invention, the laser can be located off of the substrate 12. In these embodiments of the present invention, the light 26 from the laser 24 can be coupled into an optical waveguide 30 on the substrate 12 using an optical fiber or using free-space coupling (e.g. with a lens). The light 26 can then be routed through the optical waveguide 30 to the modulator input 28.

In some cases, a single laser 24 can be used to provide the light 26 for both of the optical logic gates 14. This can be done, for example, using a 1×2 optical coupler which splits the light 26 from the single laser 24 into two substantially equal portions with one portion of the light 26 being routed through an optical waveguide 30 to each modulator input 28.

The optical input signals provided at the Set and Reset inputs 102 and 102', respectively, in FIG. 1 can also be coupled into the optical data latch 10 using optical fibers or by free-space coupling. Each optical input signal for the Set input 102 or for the Reset input 102' can comprise a stream of digital optical data which is provided to the optical data latch 10, as needed, to store optical information therein one bit at a time, with the logic states of the Q and $\overline{Q}$ outputs 100, 100' being switched dependent upon the logic states of the Set and Reset inputs 102, 102' as previously described. Thus, the Q and $\overline{Q}$ outputs can also be complementary streams of digital optical data. A plurality of optical data latches 10 can also be interconnected to form a clocked optical data shift register 110 as will be described in detail hereinafter.

Figure 2:
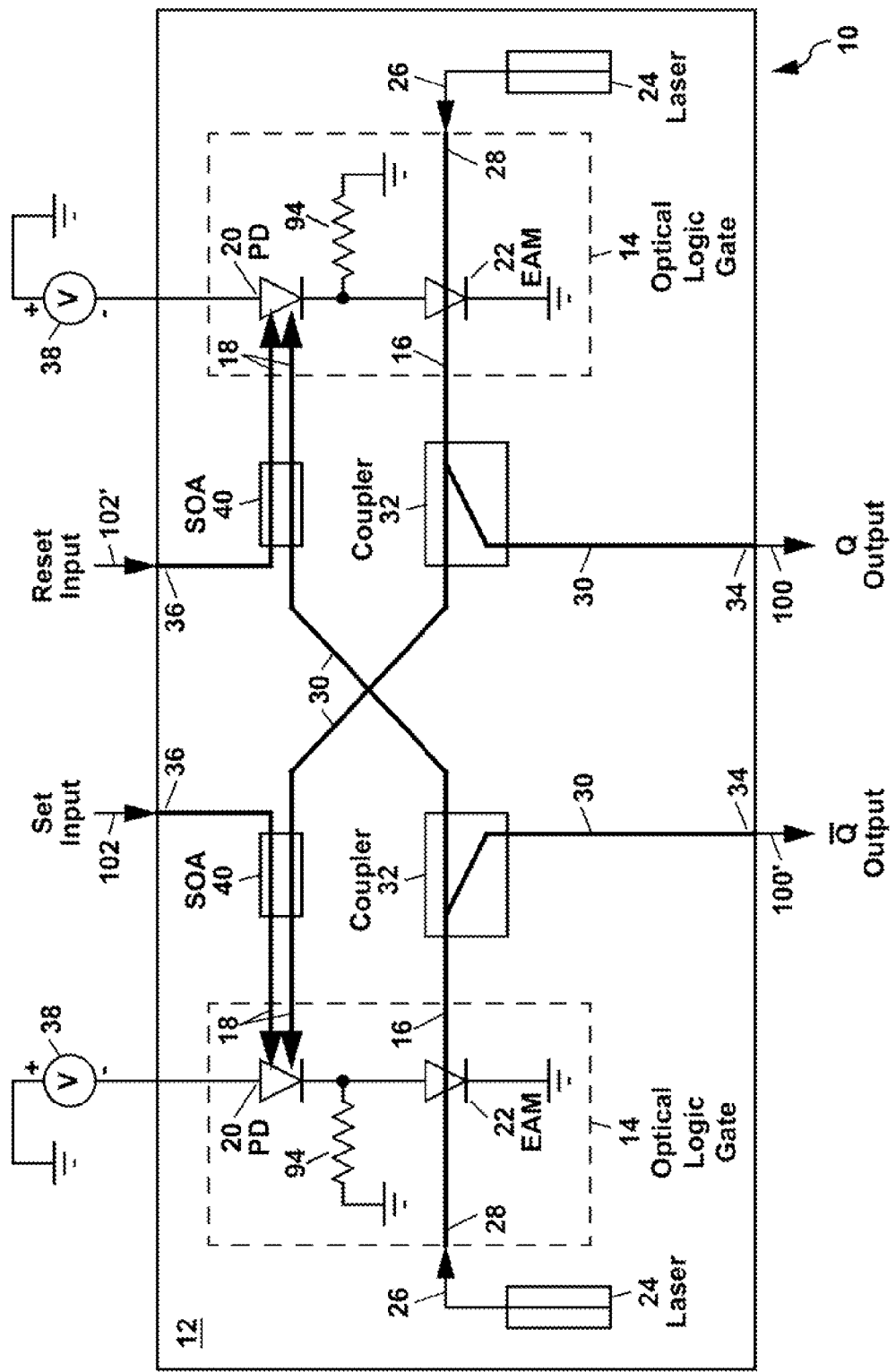
FIG. 2 shows a schematic diagram of a second example of the optical data latch of the present invention wherein the optical logic gates are optical NOR gates.

FIG. 2 shows a schematic diagram of a second example of the optical data latch 10 of the present invention wherein the optical logic gates 14 are optical NOR gates. In this example of the optical data latch 10, two photodetector inputs 18 are provided for each PD 20, with the transmitted light 26 being coupled into one of the photodetector inputs 18, and with the Set input 102 or the Reset input 102' being coupled into the other photodetector input 18. Thus, providing a second photodetector input 18 for each PD 20 effectively converts the optical logic gates 14 from being NOT gates to being NOR gates. The operation of the optical data latch 10 of FIG. 2 is similar to that of FIG. 1 which has been described previously.

In the example of FIG. 2, the transmitted light 26 and the Set and Reset inputs 102 and 102', respectively, can each be amplified by a pair of SOAs 40 prior to being coupled into the PDs 20. In other embodiments of the present invention, the transmitted light 26 in the output 16 of each optical logic gate 14 can be combined with the Set or Reset input 102, 102' prior to being coupled into each PD 20 using a single photodetector input 18. This can be done, for example, using a branching-waveguide Y-junction or a 2×1 MMI coupler 32 to provide a single optical output from two optical inputs. The branching-waveguide Y-junction or the 2×1 MMI coupler 32 can be located either before or after the SOA 40.

Figure 3:
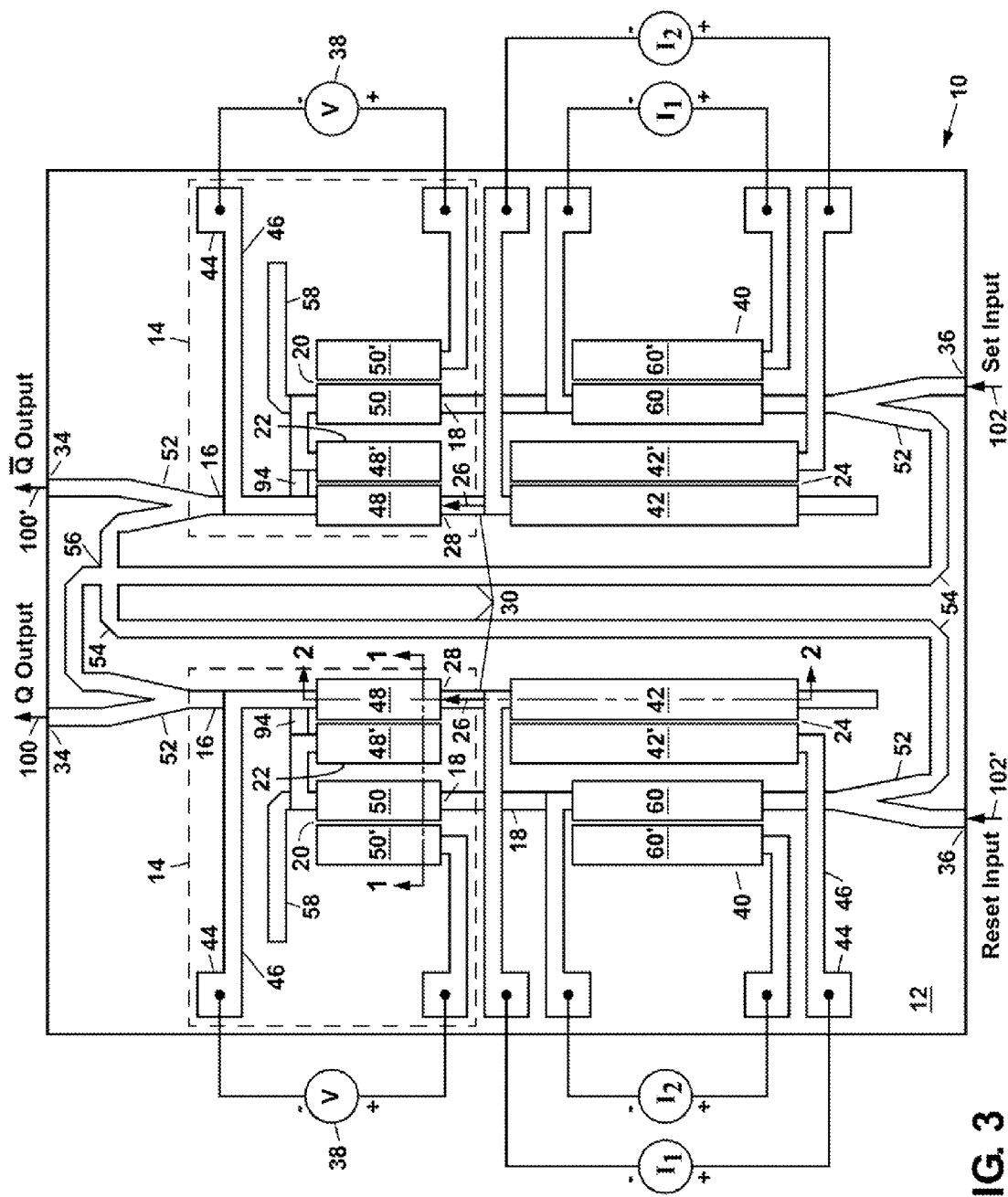
FIG. 3 shows a schematic plan view of a third example of the optical data latch of the present invention wherein the optical logic gates are optical NOT gates.

FIG. 3 shows a schematic plan view of a third example of the optical data latch 10 of the present invention to illustrate further details of the PD 20, the EAM 22, the laser 24 and the SOA 40 and to show how the optical data latch 10 can be formed as an in-line structure with the Set and Reset inputs located on one side of the substrate 12 and the Q and $\overline{Q}$ outputs located on an opposite side of the substrate 12. This in-line structure is useful to simplify coupling optical signals into and out of the latch 10 and also to allow multiple latches 10 to be cascaded on the substrate 12 to form a clocked optical data shift register 110 (see FIGS. 6 and 8).

In FIG. 3, each laser 24 can be a DBR laser having an upper electrode 42 and a lower electrode 42'. Each DBR laser 24 can be forward-biased using a dc current source $I_1$ which can be located off of the substrate 12 and connected to the DBR laser 24 using a pair of bond pads 44 and wiring 46 formed on the substrate 12. The light 26 from each laser 24 in FIG. 3 is directed through an optical waveguide 30 into the adjacent EAM 22 at the modulator input 28.

The EAM 22 and PD 20 in each optical logic gate 14 in FIG. 3 are formed as waveguide devices, with each optical logic gate 14 being an optical NOT gate (i.e. an optical inverter). Each EAM 22 has an upper electrode 48 and a lower electrode 48'; and each PD 20 also has an upper electrode 50 and a lower electrode 50'. Each EAM 22 is electrically connected in series with the adjacent PD 20. This can be done, for example, by connecting the lower electrode 48' of the EAM 22 to the upper electrode 50 of the PD 20 using wiring 46 which can be in the form of an rf transmission line. Low-loss rf by-pass capacitors can also be used, but these capacitors, which are well-known in the art, have been omitted from FIG. 3 for clarity. In FIG. 3, a resistor 94 can be connected between the wiring 46 to the electrodes 48 and 48' of the EAM 22 to place the resistor 94 in parallel with the EAM 22. The wiring 46 allows a reverse-bias voltage V from an external dc power supply 38 to be applied across both the PD 20 and the parallel combination of the EAM 22 and resistor 94 in each optical logic gate 14. The reverse-bias voltage V can be, for example, a few volts (e.g. −5 V). Although two separate dc power supplies 38 are shown in FIG. 3, those skilled in the art will understand that the reverse-bias voltage V for each optical logic gate 14 can be provided by a single dc power supply 38.

The photocurrent generated by the PD 20 in each optical logic gate 14 in response to detection of the light 26, the Set input 102 or the Reset input 102' is relatively independent of an electric field produced in the PD 20 by the amount of the reverse-bias voltage V applied across that PD 20, and depends only upon the intensity of the detected light. On the other hand, the transmission of the light 26 through the EAM 22 in each optical logic gate 14 depends upon the amount of the reverse-bias voltage V applied to the EAM 22 which produces an absorption of the light 26 due to a Franz-Keldysh effect or a quantum-confined Stark effect. With a relatively small amount of the reverse-bias voltage V (e.g. a few tenths of a Volt) from the dc power supply 38 being applied across the EAM 22, the absorption will be relatively low so that a relatively high level of the light 26 will be transmitted through the EAM 22 so that the output 16 will be bright and in a logical "1" state. When the amount of the reverse-bias voltage V applied across the EAM 22 is relatively large (e.g. a few Volts), then the absorption will also be large so that a low level of the light 26 will be transmitted through the EAM 22 to the output 16 which will be dark corresponding to a logical "0" state. Thus, the EAM 22 acts as a switch to turn "on" or "off" the transmission of the light 26 from the laser 24 and thereby provide a bright or dark light signal at the output 16 of each optical logic gate 14 and also at the Q or $\overline{Q}$ outputs for the optical data latch 10.

The amount of the reverse-bias voltage V which is applied across the EAM 22 depends upon a photocurrent produced by the PD 20 from detection of the light 26 or the Set or Reset inputs 102, 102'. This photocurrent primarily flows through the resistor 94, which is generally connected in parallel with the EAM 22, and thereby controls the amount of the reverse-bias voltage V which is dropped across the combination of the resistor 94 and EAM 22 which are electrically connected in parallel. Little or no photocurrent is generated by the PD 20 when the photodetector input 18 is dark and in a logical "0" state; and a relatively large photocurrent will be generated by the PD 20 when the photodetector input 18 is bright and in a logical "1" state.

To provide a bi-stable optical feedback loop to achieve the optical data latching function of the latch 10, the output 16 of each optical logic gate 14 is optically connected to the photodetector input 18 of the other optical logic gate 14. In the example of FIG. 3, this is done using a plurality of optical waveguides 30 which include a branching-waveguide Y-junction 52 to split the transmitted light 26 at the output 16 of each EAM 22 into two substantially equal portions, with one portion of the transmitted light 26 being directed into the photodetector input 18 of the other optical logic gate 14, and with the other portion of the transmitted light 26 forming a Q or $\overline{Q}$ optical output 100 or 100', respectively. The optical waveguides 30 can also include a plurality of 45° turning mirrors 54 as shown in FIG. 3. Additionally, a waveguide crossing 56 can be used to allow the waveguides 30 to cross through each other as shown in FIG. 3. The waveguide crossing 56 can be formed by intersecting two waveguides 30 at substantially right angles to each other. L-shaped optical waveguides 58 can also be provided to trap any of the light which is not absorbed by the PDs 20. The various optical waveguides 30 and 58 in the example of FIG. 3 can be single-mode optical waveguides or multi-mode optical waveguides.

In the optical data latch 10 of FIG. 3, a portion of the transmitted light 26 from the output 16 of each optical logic gate 14 is coupled back to the photodetector input 18 of the other optical logic gate 14. This can be done through additional branching-waveguide Y-junctions 52 which are shown at the bottom of FIG. 2. These branching-waveguide Y-junctions 52 allow the Set or Reset inputs 102, 102' to be combined with the light 26 prior to the photodetector input 18. The combined light 26 and optical input signals 102, 102' are amplified in the example of FIG. 3 using a SOA 40 prior to reaching the photodetector input 18 for each optical logic gate 14.

Each SOA 40 in FIG. 3 can comprise an upper electrode 60 and a lower electrode 60' which are connected through wiring 46 and bond pads 44 to another dc current source $I_2$ which can be located off of the substrate 12. This dc current source $I_2$ forward biases the SOA 40 to produce optical gain in a gain region therein which amplifies the light which passes through the SOA 40. The gain region in each SOA 40 can be either single-mode or multi-mode with a width of, for example, 1-10 μm and a length of, for example, 100-500 μm. In some cases, the width of the gain region can be flared, with a width that increases along the length of the SOA 40. An offset multi-quantum-well (MQW) can also be used in the gain region. The use of a flared or offset MQW gain region can be useful to provide a higher saturation power level for the SOA 40 for the light being amplified by the SOA 40. Although two dc current sources $I_2$ are shown in FIG. 3, those skilled in the art will understand that a single dc current source $I_2$ can be used to power both SOAs 40.

Figure 4:
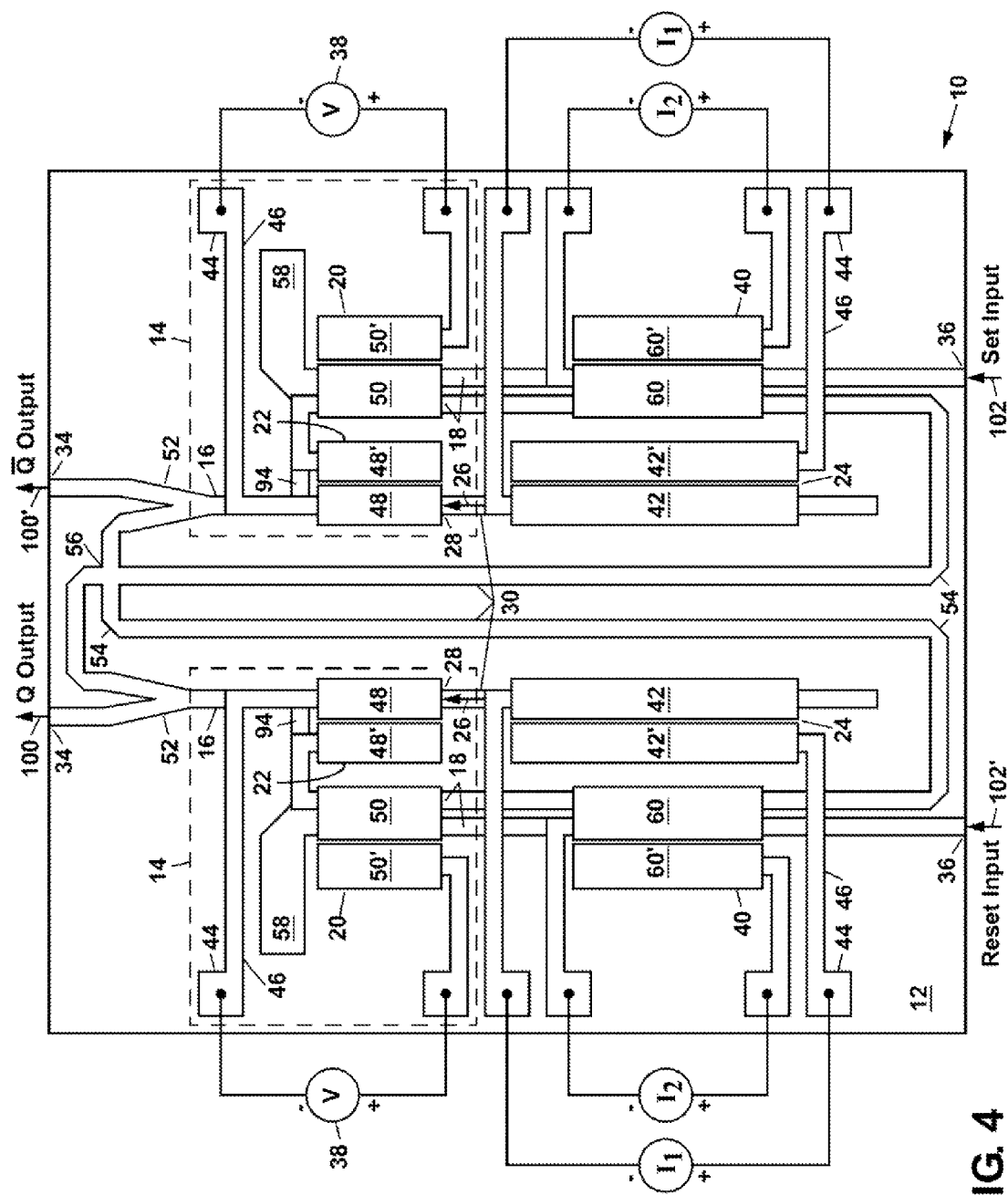
FIG. 4 shows a schematic plan view of a fourth example of the optical data latch of the present invention wherein the optical logic gates are optical NOR gates.

FIG. 4 shows a schematic plan view of a fourth example of the optical data latch 10 of the present invention. This fourth example of the optical data latch 10 is similar to that of FIG. 3 except that each optical logic gate 14 is an optical NOR gate having two photodetector inputs 18 for each PD 20. One of the photodetector inputs 18 for each PD is used to couple the transmitted light 26 into that PD 20, and the other photodetector input 18 is used to couple either the Set input 102 or the Reset input 102' into that PD 20. Each PD 20 can be, for example, 10 μm wide, with any of the light not absorbed in the PD 20 being routed into a multi-mode L-shaped waveguide 58.

In the example of FIG. 4, an SOA 40 is used to amplify the light 26 and the Set or Reset input 102, 102' before each PD 20. The SOA 40 can be formed similar to a 2×2 MMI coupler, but with optical gain to amplify the light provided at each input to the SOA 40.

The optical data latch 10 of FIG. 4 operates in a manner similar to that described previously with reference to FIGS. 2 and 3.

Fabrication of the optical data latch 10 of the present invention will now be described with reference to FIGS. 5A-5G which show a series of schematic cross-section views of the device 10 along the section line 1-1 in FIG. 3 during various steps in the fabrication of the optical data latch 10, and with reference to FIG. 5H which shows a schematic cross-section view along the section line 2-2 in FIG. 3. The optical data latch 10 can be fabricated using a quantum-well intermixing process. This quantum-well intermixing process uses a III-V compound semiconductor substrate 12 upon which a plurality of III-V compound semiconductor layers are epitaxially grown. The III-V compound semiconductor substrate 12 can comprise, for example, indium phosphide or gallium arsenide. This quantum-well intermixing process allows the fabrication of many different photonic integrated circuit (PIC) elements to be formed on the same substrate 12 in a manner similar to that of semiconductor integrated circuit (IC) fabrication. The quantum-well intermixing process also allows the various PIC elements, which can include the optical waveguides 30 and 58, the PDs 20, the EAMs 22, DBR lasers 24, and SOAs 40, to be individually optimized.

Those skilled in the art will understand that the optical data latch 10 of the present invention can also be fabricated using other types of III-V compound semiconductor fabrication methods which are well-known in the art. These other types of III-V compound semiconductor fabrication methods include butt-joint regrowth, selective area growth, and the use of offset quantum wells and are detailed in the following articles which are incorporated herein by reference: E. Skogen et al., "Monolithically Integrated Active Components: A Quantum-Well Intermixing Approach," *IEEE Journal of Selected Topics in Quantum Electronics*, vol. 11, pp. 343-355, March/April 2005; J. W. Raring et al., "40-Gb/s Widely Tunable Transceivers," *IEEE Journal of Selected Topics in Quantum Electronics*, vol. 13, pp. 3-14, January/February 2007.

Figure 5A:
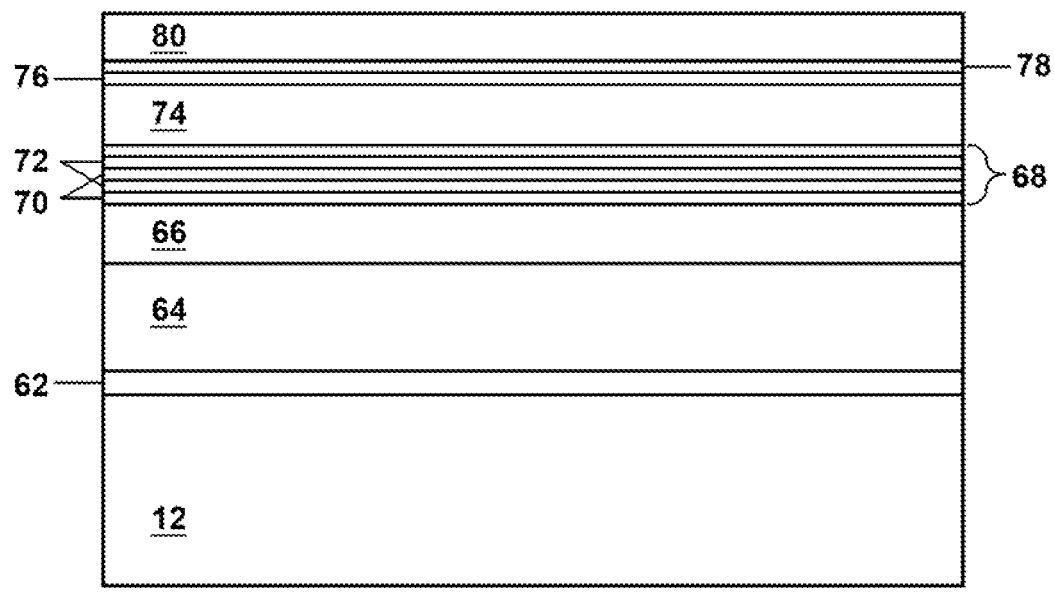
FIGS. 5A-5H show schematic cross-section views along the section lines 1-1 and 2-2 in FIG. 3 to illustrate a series of process steps in the fabrication of the optical data latch of the present invention.
Figure 5B:
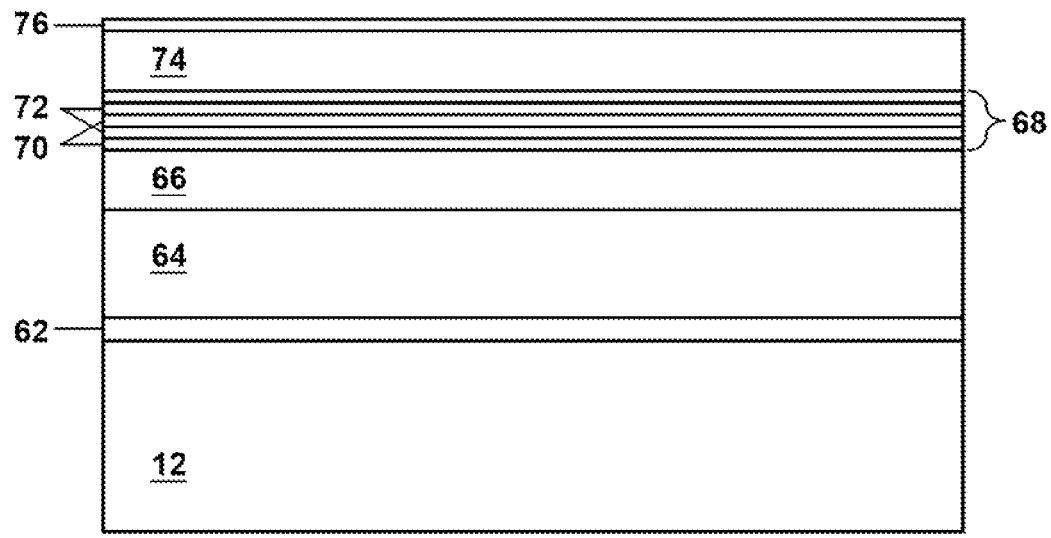

FIG. 5A shows a schematic cross-section view of the plurality of III-V compound semiconductor layers 62 through 80 which can be initially epitaxially grown on the substrate 12 in preparation for fabricating the optical data latch 10 of the present invention. The III-V compound semiconductor layers can comprise, for example, indium phosphide (InP), indium gallium arsenide phosphide (InGaAsP), indium gallium arsenide (InGaAs), indium aluminum gallium arsenide (InAlGaAs) layers and combinations thereof when the substrate 12 comprises InP. Alternately, the III-V compound semiconductor layers can comprise gallium arsenide (GaAs), aluminum gallium arsenide (AlGaAs), InGaAsP, InGaAs, and combinations thereof when the substrate 12 comprises GaAs. The following discussion will describe fabrication of the optical data latch 10 using an InP substrate 12 with InP, InGaAsP and InGaAs layers thereon, but those skilled in the art will understand that the various process steps described hereinafter can be applied with minor modifications to an optical data latch 10 formed on a GaAs substrate 12 with a combination of GaAs, AlGaAs, InGaAsP, and InGaAs layers epitaxially grown thereon. Those skilled in the art will also understand that other III-V compound semiconductor materials can be used for the substrate 12 and the layers epitaxially grown thereon.

In FIG. 5A, the substrate 12 can comprise a semi-insulating Fe-doped InP substrate 12. A plurality of III-V compound semiconductor layers are epitaxially grown on the Fe-doped InP substrate 12 by metal-organic chemical vapor deposition (MOCVD). These III-V compound semiconductor layers are in order of epitaxial growth: an InP buffer layer (not shown), an n-type InGaAs lower contact layer 62; a lower cladding layer 64 of n-type-doped InP which can be 1-2 μm thick; a lower waveguide layer 66 of InGaAsP which is undoped (i.e. not intentionally doped) and about 0.11 μm thick with a composition selected to provide an energy bandgap wavelength $\lambda_g$=1.3 μm; an undoped MQW region 68 which is about 0.11 μm thick and comprises a plurality of alternating quantum well (QW) layers 70 and barrier layers 72 of InGaAsP, with the quantum well layers 70 being about 6.5 nanometers (nm) thick and having an energy bandgap wavelength $\lambda_g$ of, for example, 1.55 μm as measured by photoluminescence, and with the barrier layers 72 being about 8 nm thick and having an energy bandgap wavelength $\lambda_g$=1.3 μm; a upper waveguide layer 74 of undoped InGaAsP about 0.11 μm thick with $\lambda_g$=1.3 μm; an undoped InP etch stop layer 76 about 15 nm thick; an undoped InGaAsP etch stop layer 78 about 20 nm thick with $\lambda_g$=1.3 μm; and an undoped InP implant buffer layer 80 about 0.45 μm thick. As an example, the QW layers 70 can have the semiconductor alloy composition $In_xGa_{1-x}As_yP_{1-y}$ with x=0.735 and y=0.840 to provide the energy bandgap wavelength $\lambda_g$=1.55 μm; and the barrier layers 72 can be formed of $In_xGa_{1-x}As_yP_{1-y}$ with x=0.735 and y=0.513. Those skilled in the art will understand that the exact compositions and thicknesses of the layers 70 and 72 in the MQW region 68 and the compositions and thicknesses of the other III-V compound semiconductor layers can be adjusted as needed to provide predetermined values for energy bandgaps of these layers, with the energy bandgap wavelength $\lambda_g$ of the QW layers 70 generally being in the range of 0.8-2.0 μm.

An ion implant mask (e.g. comprising silicon nitride about 0.5 μm thick) can then be provided over the substrate 12 and III-V compound semiconductor layers with openings at locations wherein phosphorous ions are to be implanted into the InP implant buffer layer 80 for use in selectively disordering the MQW region 68. The locations where the PDs 20 and a gain region of the DBR lasers 24 and SOAs 40 are to be formed will generally not have a disordered MQW region 68 since the MQW region 68 is epitaxially grown to optimize the performance of the PDs 20 and the gain region of the DBR lasers 24 and SOAs 40. The phosphorous ions can be implanted into the InP implant buffer layer 80 at an ion energy of about 100 keV and a dose of about $5\times10^{14}$ cm$^{-2}$ with the substrate 12 being at a temperature of about 200° C. The implanted phosphorous ions produce point defects in the InP implant buffer layer 80.

A rapid thermal annealing step can then be used to drive the point defects down into the MQW region 68 to intermix the QW layers 70 and the barrier layers 72 at the interfaces therebetween. This intermixing produces a blue-shift the energy bandgap wavelength in the MQW region 68. The rapid thermal annealing step can be performed at a temperature in the range of 630-700° C. and can be timed for a time interval from about one-half minute up to a few tens of minutes to provide a predetermined energy bandgap wavelength for the MQW region 68 which will depend upon the exact elements of the optical data latch 10 being formed. To form the EAMs 22 in each optical logic gate 14, a first rapid thermal annealing step can be used to provide a few tens of nanometer blue-shift in the energy bandgap wavelength of the MQW region 68 (e.g. to $\lambda_g$~1.50 μm) to reduce an absorption loss therein in the absence of any reverse-bias voltage. This same blue-shift is provided for the MQW region 68 for the optical waveguides 30 and for distributed Bragg reflector (DBR) mirror regions which are used to form an optical cavity for the DBR laser 24 in each optical logic gate 14 and for an optional phase control region located within the optical cavity of each DBR laser 24. An additional blue-shift will be provided in a subsequent thermal annealing step for the optical waveguides 30 and the DBR mirror regions to further increase the blue-shift therein (e.g. to $\lambda_g$~1.43 μm) and thereby further reduce the absorption for these elements of the optical data latch 10. The blue-shift in the energy bandgap wavelength of the MQW region 68 can be determined using a laser-excited photoluminescence spectroscopy measurement at room-temperature.

After the first rapid thermal annealing step, the InP implant buffer layer 80 can be removed above the EAMs 22 while leaving the layer 80 in place over the optical waveguides 30 and over the DBR mirror regions. This can be done using a wet etching step to etch away the layer 80, with the wet etching being terminated upon reaching the InGaAsP etch stop layer 78. Removal of the InP implant buffer layer 80 above the EAMs 22 prevents any further blue-shift in the MQW region 68 at these locations since it removes the source of point defects necessary for quantum-well intermixing.

A second rapid thermal annealing step can then be performed at about the same temperature for up to a few minutes (e.g. 2-3 minutes) to provide further intermixing of the QW and barrier layers 70 and 72, respectively, to produce an additional few tens of nanometers blue-shift the energy bandgap of the MQW region 68 in the remaining regions where the InP implant buffer layer 80 is still present. This additional blue-shift in the energy bandgap of the MQW region 68 further reduces the absorption loss in the optical waveguides 30 and in the DBR mirror regions of the lasers 24.

After the second rapid thermal annealing step is performed, the remaining InP implant buffer layer 80 and the InGaAsP etch stop layer 78 can be completely removed from the substrate 12 by wet etching. This is schematically illustrated in the cross-section view of FIG. 5B. Another etching step can then be used to etch a corrugated grating structure down partway into the upper waveguide layer 74 to form a DBR mirror at each end of each DBR laser 24. A rear DBR mirror for each DBR laser 24 can be formed with a length of, for example, 200 μm, and a front DBR mirror in each DBR laser 24 can have a length of, for example, 10-50 μm long. The gain region of each DBR laser 24 can have a length of, for example, 200-500 μm. When a separately-contacted phase control section is to be provided in each DBR laser 24 to provide for tuning of the wavelength of the light 26 generated by the DBR laser 24, the phase control section can have a length of, for example, 75 μm and can be connected through wiring 46 on the substrate 12 to a separate bond pad 44 (not shown in FIG. 3).

Figure 5C:
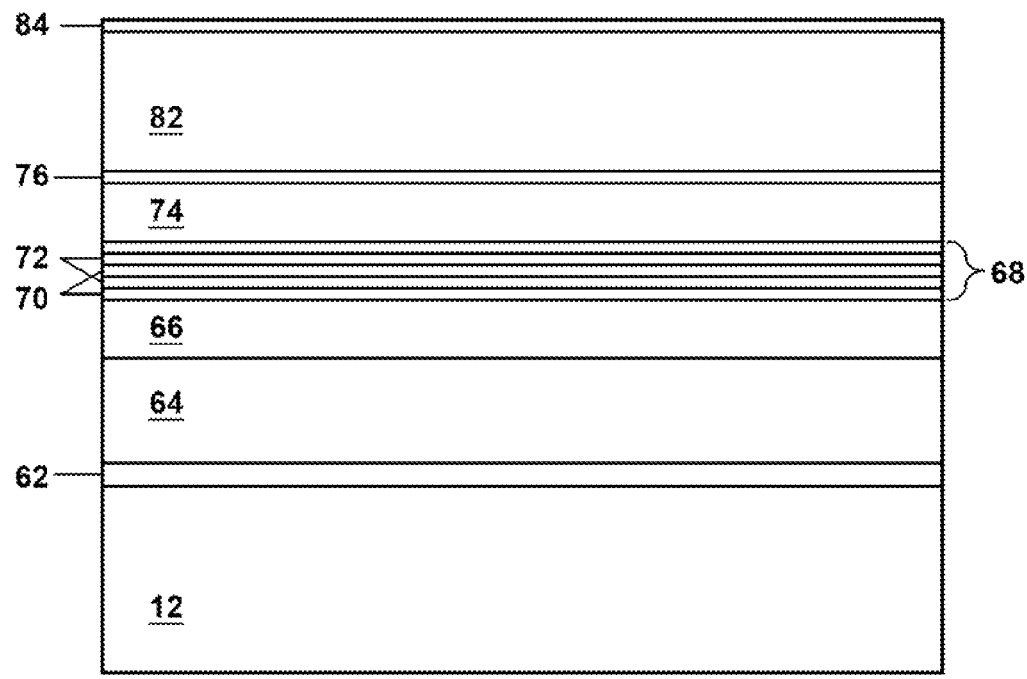

A blanket MOCVD regrowth can then be performed to epitaxially grow an upper cladding layer 82 of p-type-doped InP which can be, for example, 2.35 μm thick followed by a cap layer 84 of p-type-doped InGaAs about 0.2 μm thick. This is shown in FIG. 5C. The p-type-doped InP upper cladding layer 82 in combination with the n-type-doped lower cladding layer 64 form a semiconductor p-i-n junction about the MQW region 68 and waveguide layers 66 and 74 which are undoped (i.e. intrinsic). This semiconductor p-i-n junction is used for electrically-activated elements in the optical data latch 10 including the waveguide photodetectors 20, the EAMs 22 and the gain regions of the DBR lasers 24 and SOAs 40.

In other embodiments of the present invention, an offset quantum-well region can be epitaxially grown above the upper waveguide layer 74. This can be useful to form the PDs 20 as uni-traveling carrier photodetectors, and can also be useful in forming the SOAs 40. The use of an offset quantum-well region provides a lower confinement factor than the MQW region 68 and this lower confinement factor can increase the saturation power level for the PDs 20 and the SOAs 40, and can also allow operation at higher frequencies (i.e. higher optical data rates). Further details of the fabrication of photodetectors and semiconductor optical amplifiers using offset quantum-well region can be found in an article by J. W. Raring et al., "Design and Demonstration of Novel QW Intermixing Scheme for the Integration of UTC-Type Photodiodes with QW-Based Components," *IEEE Journal of Quantum Electronics*, vol. 42, pp. 171-181, February 2006, which is incorporated herein by reference.

Figure 5D:
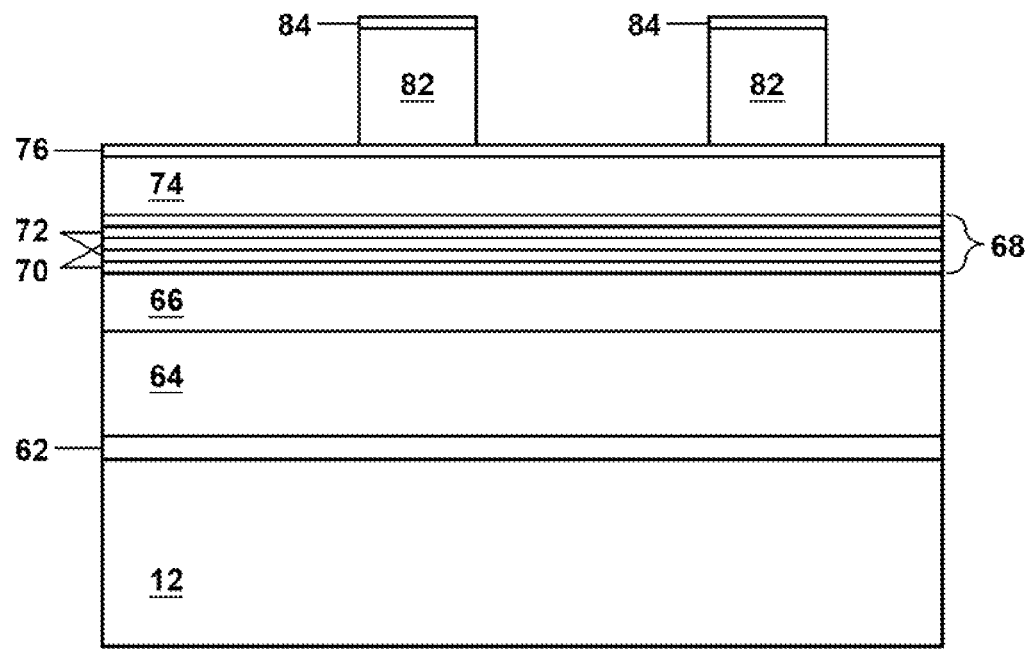

An etch mask (not shown) can be provided over the substrate 12 and photolithographically patterned for use in etching down through the InGaAs cap layer 84 and the InP upper cladding layer 82 as shown in FIG. 5D. This etching step defines an effective waveguide width of the various elements 20, 22, 24, 30, 40, 52 and 58 which can be, for example, up to a few microns or more (e.g. 1-3 μm for the optical waveguides 30, EAMs 22 and DBR lasers 24; and 1-10 μm wide for the photodetectors 20, SOAs 40 and L-shaped optical waveguides 58). The PDs 20 can each have a length of, for example, 30-70 μm and can be straight or tapered. The EAMs 22 can have a length of, for example, 100-300 μm.

Figure 5E:
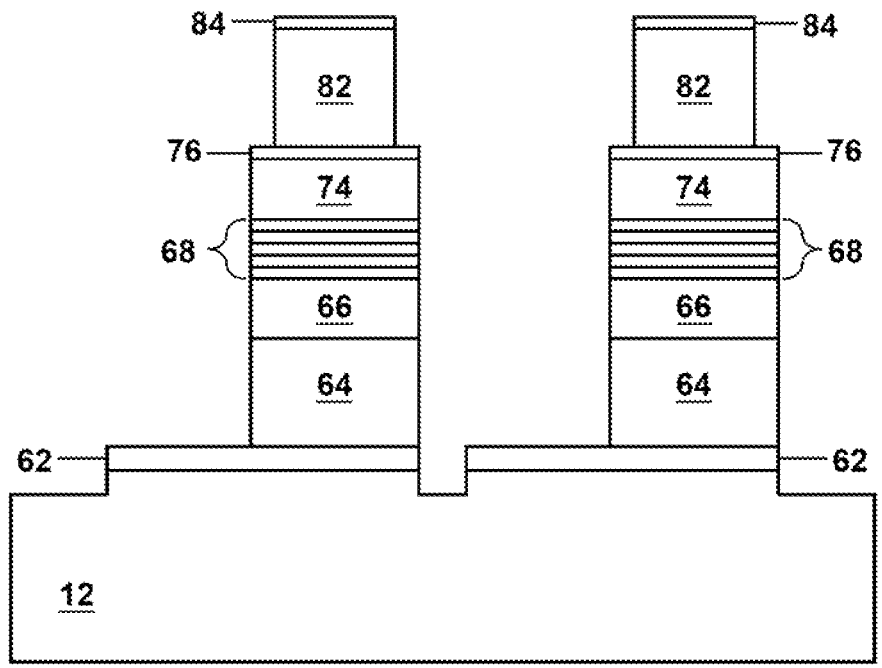

In FIG. 5E, one or more additional etching steps can be used to etch down to the InGaAs lower contact layer 62 and partway into the semi-insulating InP substrate 12. This etching step also forms the 45° mirrors 54.

Figure 5F:
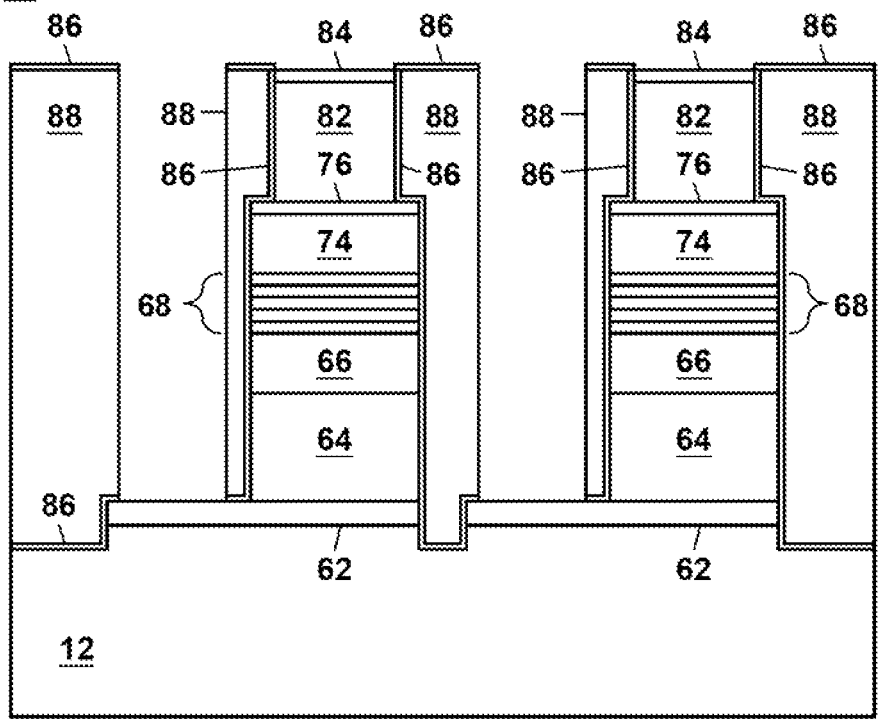

In FIG. 5F, layers of silicon nitride 86 and benzocyclobutene (BCB) 88 can then be deposited over the substrate 12 about the PDs 20, the EAMs 22, the DBR lasers 24 and the SOAs 40, with openings at the locations where the upper and lower electrodes will be formed for these elements. The BCB 88 can be optionally tapered towards the bond pads 44 allow the bond pads 44 to be formed directly over the silicon nitride layer 86 on the InP substrate 12. This tapering of the BCB 88 is also useful to allow the resistors 94 to be located on the silicon nitride layer 86 for heat sinking to the substrate 12. The silicon nitride layers 86 can each be about 0.1-0.2 μm thick.

Figure 5G:
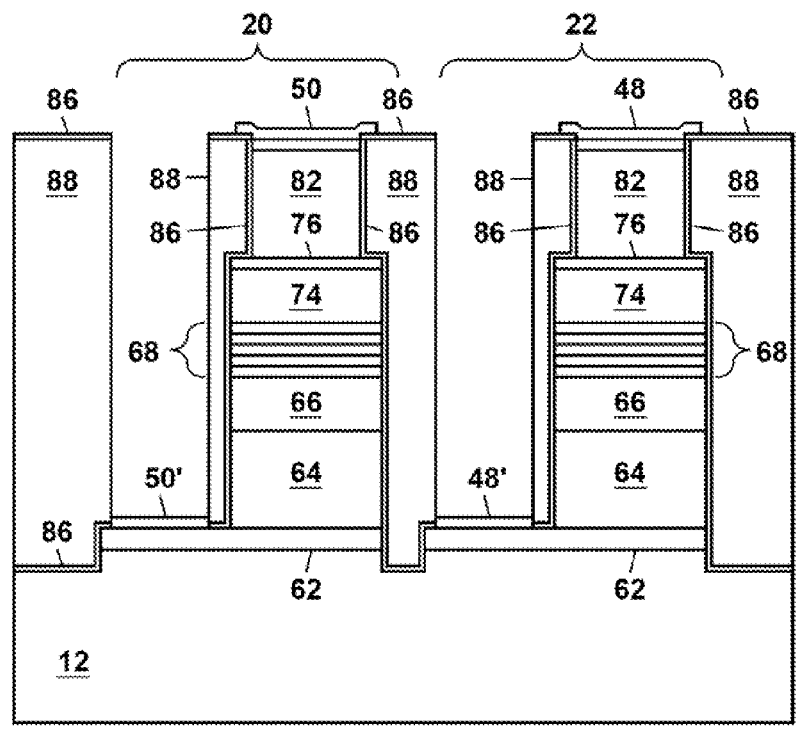

In FIG. 5G, the lower and upper electrodes can be deposited. The lower electrodes 42', 48', 50' and 60' can comprise a gold/germanium/nickel/gold (Au/Ge/Ni/Au) metallization with an overall thickness of about 0.5 μm; and the upper electrodes 42, 48, 50, 60 and the bond pads 44 and the wiring 46 can comprise a titanium/platinum/gold (Ti/Pt/Au) metallization with an overall thickness of about 1 μm. The resistors 94 can be deposited as thin-film metal resistors (e.g. comprising tantalum nitride or nichrome), and can have a resistance of, for example, 25-50 Ohms.

Adjacent elements of the optical data latch 10, which are not optically connected, can be electrically isolated by etching down partway into the semi-insulating InP substrate 12 as shown in FIG. 5G. However, this does not electrically isolate adjacent elements of the optical data latch 10 which must be optically connected via one of the optical waveguides 30. For these elements including the EAMs 22 which are optically connected to the DBR lasers 24 and the PDs 20 which are optically connected to the SOAs 40, the III-V compound semiconductor layers in an optical waveguide region between these optically-connected elements can be ion implanted to provide electrical isolation. This is illustrated in the schematic cross-section view of FIG. 5H which is taken along the section line 2-2 in FIG. 3.

Figure 5H:
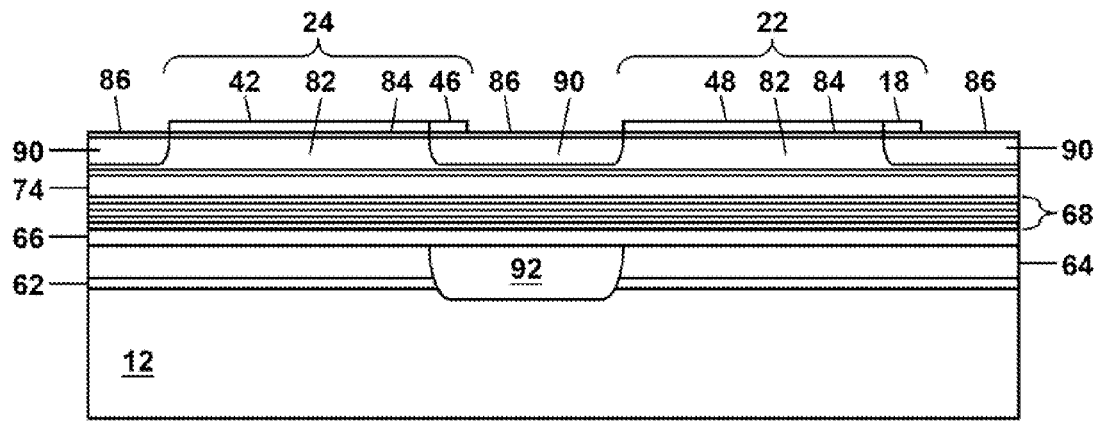

In FIG. 5H, hydrogen ions can be implanted at an energy of about 200 keV to electrically isolate regions 90 of the p-type-doped III-V compound semiconductor layers; and helium ions can be implanted at an energy of about 2 MeV to electrically isolate regions 92 of the n-type-doped III-V compound semiconductor layers, with the helium-implanted regions 92 extending down partway into the InP substrate 12. The hydrogen-implanted regions 90 can also extend around the electrically-active elements 20, 22, 24 and 40 as shown in FIG. 5H to improve the electrical characteristics of these elements. The helium-implanted regions 92 are located where the n-type-doped III-V compound semiconductor layers extend between the DBR lasers 24 and the EAMs 22, and also between the SOAs 40 and the PDs 20 in the completed device 10. The ion implantation steps can be performed with suitable masking to protect the electrically-active elements after epitaxial growth of the InP layer 82 and the InGaAs cap layer 84 as previously described with reference to FIG. 5C.

Figure 6:
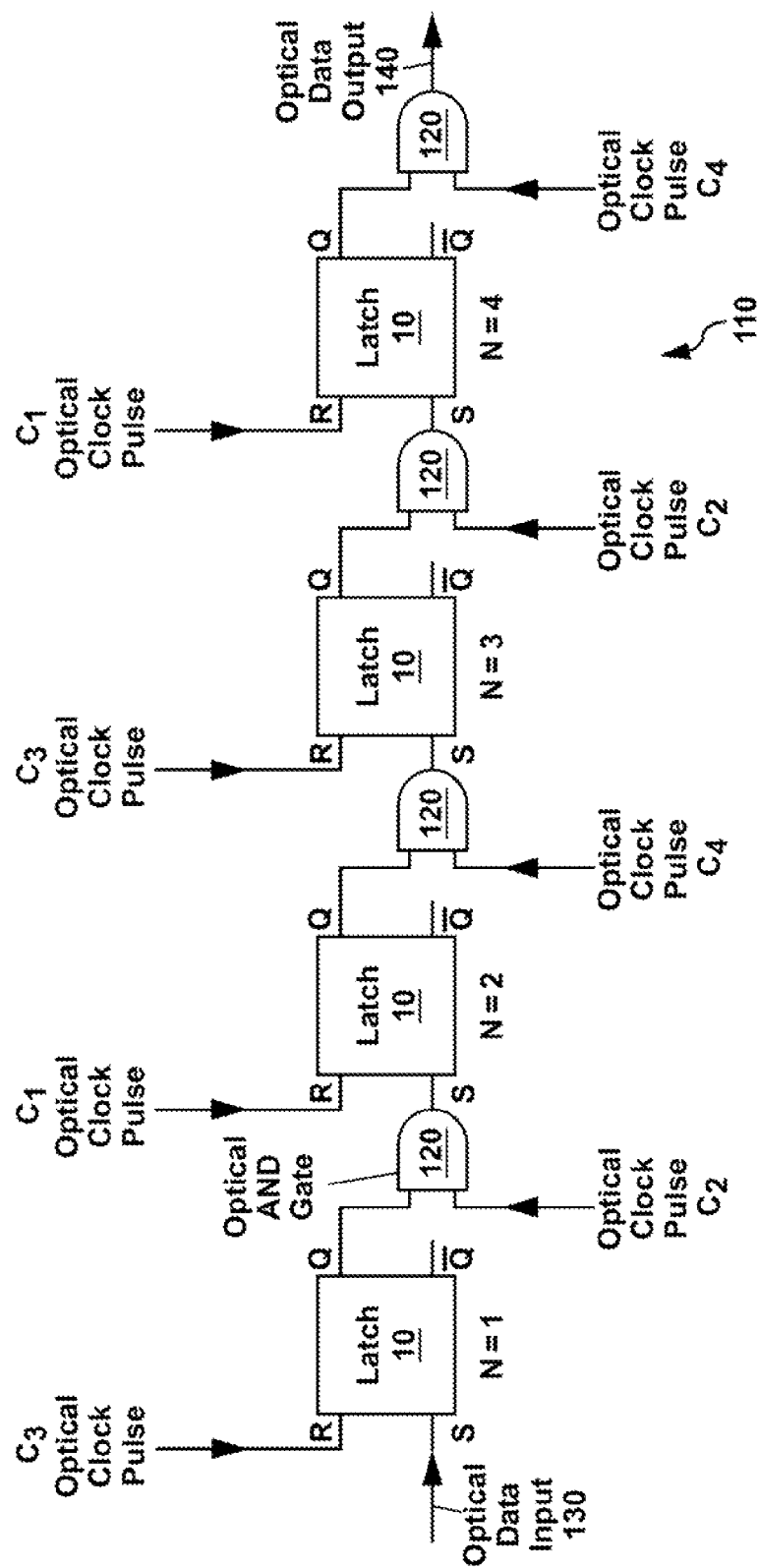
FIG. 6 shows a first example of a clocked optical data shift register which can be formed from a plurality of optical data latches of the present invention.

FIG. 6 shows a schematic block diagram of a first example of a clocked optical data shift register 110 which can be fabricated from a plurality of optical data latches 10 formed as in the examples of FIGS. 2-4 with the input ports 36 for the Set and Reset optical input signals (also termed S and R inputs) 102 and 102', respectively, located on one side of each latch 10 and with the output ports 34 for the Q and $\overline{Q}$ optical output signals 100 and 100', respectively, being located on an opposite side of each latch 10. Although four optical data latches 10 are shown in FIG. 6, those skilled in the art will understand that the number N of optical data latches 10 is arbitrary and will depend upon how many bits of optical data (i.e. optical information) are to be stored in the shift register 110. The optical data shift register 110 can be used as an optical data storage register (i.e. an optical memory), with a stream of optical data being read into and out of the shift register 110 one bit at a time.

Figure 7A:
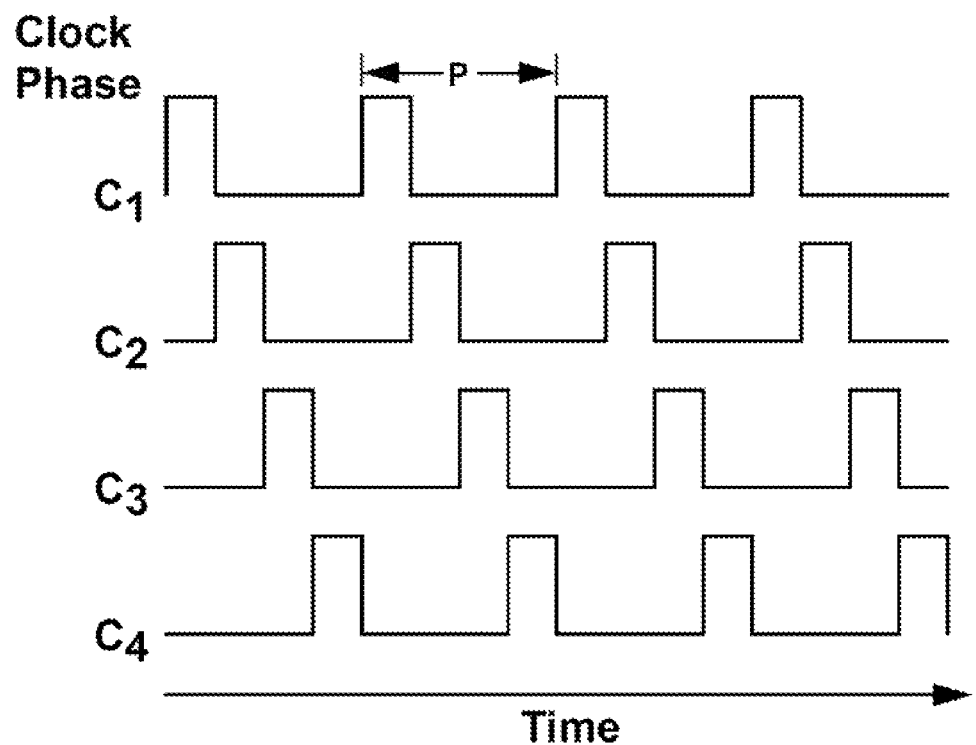
FIG. 7A schematically illustrates a timing diagram for a four-phase optical clock which can be used with the clocked optical data shift register of FIG. 6.

To form the shift register 110 in the example of FIG. 6, a four-phase optical clock can be used which provides a series of repeated clock pulses of light with the timing for the four phases $C_1$-$C_4$ being illustrated in the timing diagram of FIG. 7A. These clock pulses of light can be provided by a laser, which can be located on the same substrate 12 as the shift register 110; or the clock pulses of light can be provided from an external optical clock via free-space or optical fiber coupling to optical waveguides 30 on the substrate 12. The temporal width of each optical clock pulse will depend upon a data rate for operation of the shift register 110. The clock pulses of light with the phases $C_1$ and $C_3$ can be alternately coupled into the R inputs of the optical data latches 10; whereas the clock pulses of light with the phases $C_2$ and $C_4$ can be alternately combined with the Q outputs 100 of the latches 10 using optical AND gates 120 as shown in FIG. 6, with the output of the optical AND gates 120 being coupled into the S input of adjacent optical data latches 10.

With a bit of optical data initially stored in the latch 10 with N=1, the clock pulses with phase $C_1$ can be used to reset the even-numbered latches 10 with N=2 and N=4 thereby clearing these latches and setting them to a logical state Q=0. This prepares the even-numbered latches with N=2 and N=4 for a data transfer step whereby the bit of optical data stored in the N=1 latch and any bit of optical data which may be stored in the N=3 latch are transferred to the next adjacent latch with N=2 or N=4. The next optical clock pulse with phase $C_2$ then sets the N=2 and N=4 latches to the logic states of the Q outputs of the N=1 and N=3 latches, thereby transferring the bit of optical data stored in the N=1 latch to the N=2 latch, and also transferring any bit of optical data stored in the N=3 latch to the N=4 latch. A third optical clock pulse with phase $C_3$ then resets the odd-numbered latches with N=1 and N=3 to a logical state with Q=0 to prepare these latches to receive additional optical data. A fourth optical clock pulse with phase $C_4$, is then used to set the N=3 latch to the logic state of the Q output of the N=2 latch, and to transfer the logic state of the Q output of the N=4 latch to the optical data output 140. During the fourth optical clock pulse with phase $C_4$, another bit of optical data from the optical data input 130 can be read into the N=1 latch at the S input thereof and stored therein. This process of shifting the optical data through the shift register 110 and reading the optical data into and out of the shift register 110 can be repeated with each period P of the four-phase clock.

Figure 7B:
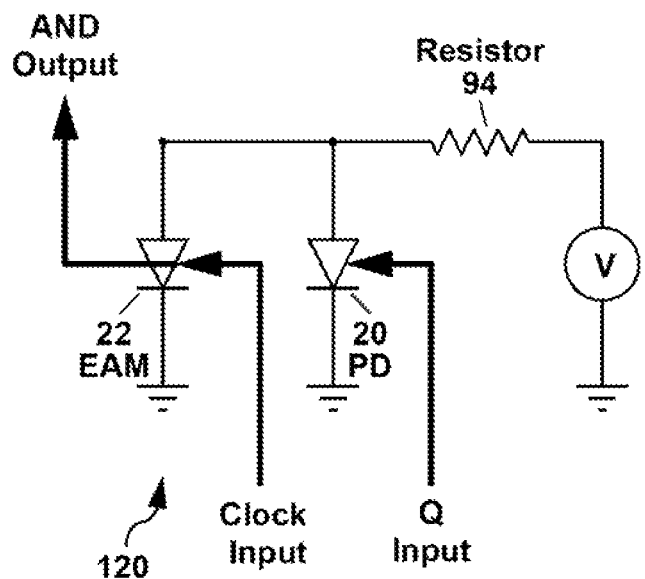
FIG. 7B shows a schematic diagram of an optical AND gate which is used in the clocked optical data shift register of FIG. 6.
Figure 7C:
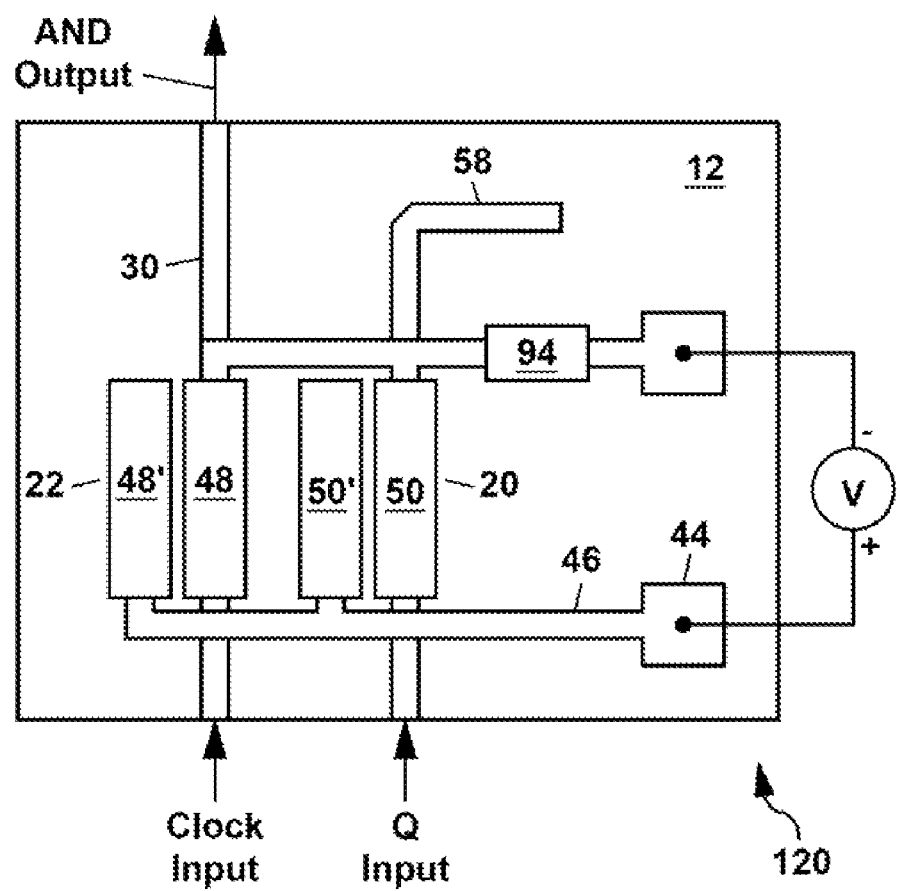
FIG. 7C shows a schematic plan view of the optical AND gate of FIG. 7B.

The optical AND gates 120 used in the shift register 110 of FIG. 6 can be formed from a PD 20 and an EAM 22 which are electrically connected in parallel through a resistor 94 to a reverse-bias voltage V. A schematic diagram for the optical AND gate 120 is shown in FIG. 7B; and a schematic plan view for laying out this AND gate 120 on a substrate 12 is shown in FIG. 7C. These optical AND gates 120 can be formed on the same substrate 12 as the optical data latches 10 using the same series of process steps described previously with reference to FIGS. 5A-5H.

When a clock input and a Q input to the optical AND gate 120 are both in a logical "1" state, then an AND output from the optical AND gate 120 will also be in the logical "1" state (i.e. the light from the clock input will be transmitted through the EAM 22 and will be available at the S input of the adjacent latch 10 in FIG. 6). Otherwise the AND output will be in a logical "0" state characterized by very little, if any, of the light from the clock input being transmitted through the EAM 22 and available at the S input of the adjacent latch 10.

Figure 8:
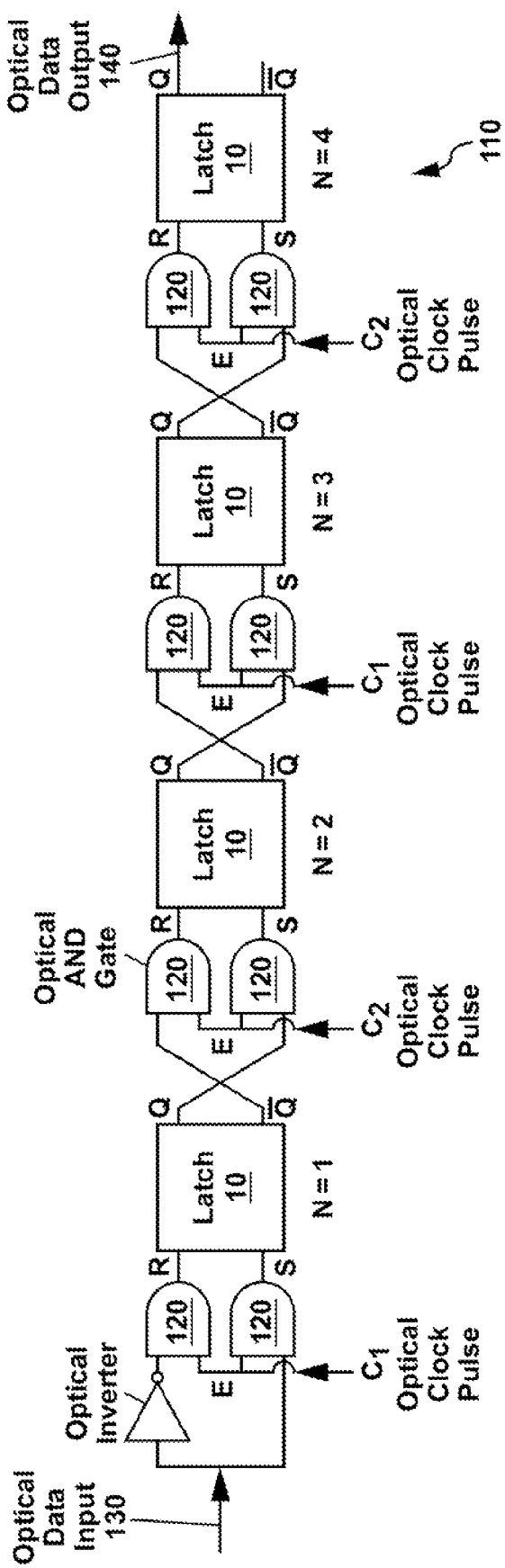
FIG. 8 shows a second example of a clocked optical data shift register which can be formed from a plurality of optical data latches of the present invention.
Figure 9:
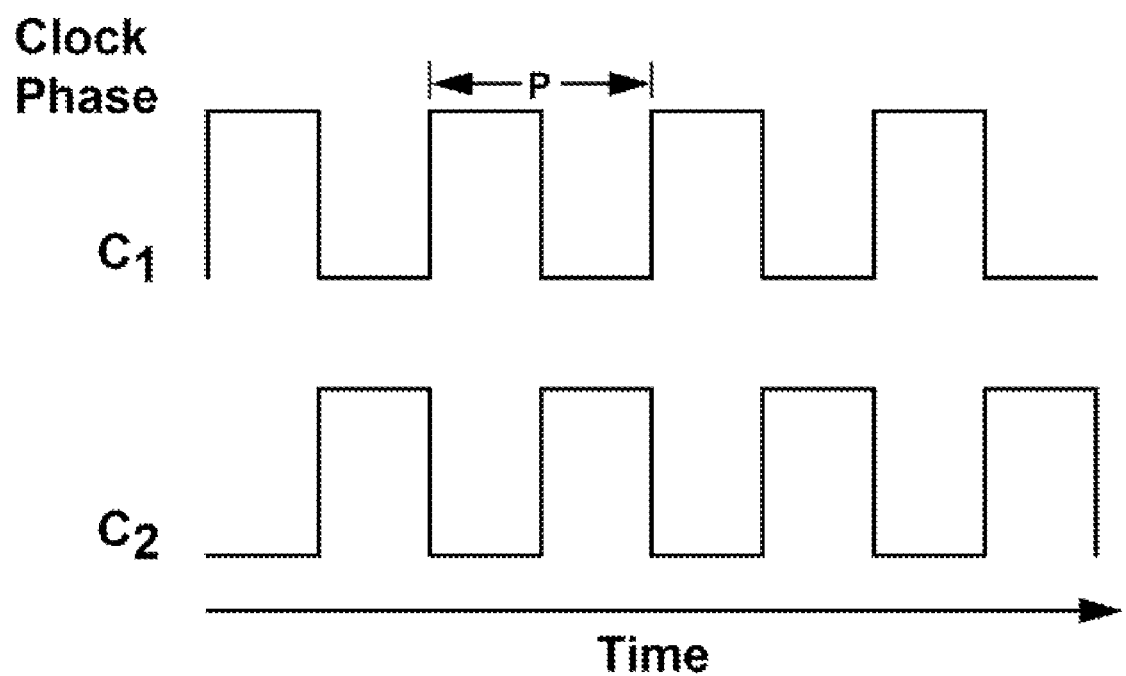
FIG. 9 schematically illustrates a timing diagram for a two-phase optical clock which can be used with the clocked optical data shift register of FIG. 8.

FIG. 8 shows a block diagram of a second example of a clocked optical data shift register 110 which can be formed from a plurality of optical data latches 10 as shown in FIGS. 2-4. This second example of the shift register 110 utilizes a two-phase optical clock with a timing diagram as illustrated in FIG. 9. Although the shift register 110 in the FIG. 8 has only four optical data latches 10 for simplification, those skilled in the art will understand that the shift register 110 of FIG. 8 can be made with an arbitrary number N of latches 10.

In the example of FIG. 8, an optical inverter, which can be formed as shown in FIG. 3, is used to generate the complement of each bit of optical data provided at the input 130 to the shift register 110. A pair of optical AND gates 120, which can be formed as shown in FIGS. 7B and 7C, can be provided on the substrate 12 adjacent to each optical data latch 10. Each pair of the optical AND gates 120 can have their clock inputs connected together to form a common enabling (E) input for simultaneously clocking the operation of that pair of optical AND gates 120. The E input allows each pair of the optical AND gates 120 to simultaneously transfer the bit of optical data and its complement to the N=1 latch 10 when enabled by the optical clock pulse having an phase $C_1$. This same clock pulse with phase $C_1$ is also provided to E input of the pair of optical AND gates 120 for the N=3 latch to transfer to the N=3 latch any bit of optical data and its complement which may be stored in the N=2 latch. It should be noted that with the S and R inputs of a particular latch 10 simultaneously receiving the Q and $\overline{Q}$ outputs from a preceding latch 10, whichever output Q or $\overline{Q}$ which is in the logical "1" state will set or reset that latch 10 while the other Q or $\overline{Q}$ output in the logical "0" state will not affect the operation of that latch 10.

During the optical clock pulse with the phase $C_1$, any bit of optical data stored in the N=4 latch 10 can be read out of the shift register 110 via the Q output of the N=4 latch 10, thereby forming the optical data output 140. The complement of this same bit of the optical data stored in the N=4 latch 10 can also be read out, if needed, via the $\overline{Q}$ output of the N=4 latch 10.

A second clock pulse with optical phase $C_2$ is then provided to transfer the bit of optical data and its complement from the N=1 latch to the N=2 latch, and to simultaneously transfer any bit of optical data and its complement from the N=3 latch to the N=4 latch. In this way, each optical clock pulse with phase $C_1$ or $C_2$ is used to synchronously read the optical data into the shift register 110 at the input 130 and to transfer the optical data one bit at a time along the length of the shift register 110 towards the optical data output 140. With a clocked optical data shift register 110, formed according to the example of FIG. 8, with N optical data latches 10, N bits of optical data can be sequentially read into the shift register 110, with the N bits of optical data being stored therein until they are sequentially read out.

The optical data shift registers 110 of FIGS. 6 and 8 can be formed on a common semiconductor substrate 12 using the series of process steps described previously with reference to FIGS. 5A-5H. Additional SOAs 40 can be provided between as needed to restore optical signal levels in the shift registers 110 described herein. As an example, since the optical clock pulses must be divided and sent to multiple latches 10 and optical AND gates 120, each optical clock pulse can be amplified using an SOA 40 which is located adjacent to one of the latches 10 or optical AND gates 120. As another example, the Q outputs of each latch 10 in the example of FIG. 6 and the Q and $\overline{Q}$ outputs of each latch 10 in the example of FIG. 8 can be amplified by SOAs 40.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An optical data latch, comprising:
   a pair of optical logic gates, with each optical logic gate comprising a waveguide electroabsorption modulator which is electrically connected in series with a waveguide photodetector having at least one photodetector input, and with each optical logic gate having a modulator input wherein light is coupled into the waveguide electroabsorption modulator with the light which is transmitted through the waveguide electroabsorption modulator forming an output for that optical logic gate; and
   a plurality of optical waveguides to connect the pair of optical logic gates in a cross-coupled arrangement wherein the output of each optical logic gate of the pair of optical logic gates is optically connected to the at least one photodetector input of the other optical logic gate of the pair of optical logic gates to couple the light therebetween and thereby bi-stably latch the optical data latch to store a bit of optical information therein, and with the plurality of optical waveguides including an input waveguide to couple an optical input signal into the at least one photodetector input of each optical logic gate to set or reset the bit of optical information stored therein, and an output waveguide to couple the bit of optical information out of the optical data latch.

2. The optical data latch of claim 1 wherein each optical logic gate comprises an optical inverter.

3. The optical data latch of claim 1 wherein each optical logic gate comprises an optical NOR gate.

4. The optical data latch of claim 1 wherein each optical logic gate further comprises a resistor which is electrically connected in parallel with the waveguide electroabsorption modulator.

5. The optical data latch of claim 1 wherein the light coupled into the modulator input is provided by a laser and is at a wavelength in the range of 0.8-2.0 microns.

6. The optical data latch of claim 5 wherein the laser comprises a distributed Bragg reflector (DBR) laser.

7. The optical data latch of claim 1 further comprising a semiconductor optical amplifier to amplify the light which is coupled between the output of each optical logic gate in the pair of optical logic gates and the at least one photodetector input of the other optical logic gate of the pair of optical logic gates.

8. The optical data latch of claim 1 wherein the pair of optical logic gates and the plurality of optical waveguides are formed on a III-V compound semiconductor substrate.

9. The optical data latch of claim 8 wherein each waveguide photodetector and each waveguide electroabsorption modulator comprises a plurality of III-V compound semiconductor layers which are epitaxially grown on the III-V compound semiconductor substrate.

10. The optical data latch of claim 9 wherein the III-V compound semiconductor substrate comprises indium phosphide (InP), and the plurality of III-V compound semiconductor layers are selected from the group consisting of indium gallium arsenide phosphide (InGaAsP) layers, indium gallium arsenide (InGaAs) layers, indium aluminum gallium arsenide (InAlGaAs) layers, and combinations thereof.

11. The optical data latch of claim 9 wherein the III-V compound semiconductor substrate comprises gallium arsenide (GaAs), and the plurality of III-V compound semiconductor layers are selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

12. An optical data latch for storing a bit of optical information, comprising:
a pair of optical logic gates located on a III-V compound semiconductor substrate, with each optical logic gate comprising a combination of a waveguide electroabsorption modulator and a resistor which are electrically connected in parallel, and with a waveguide photodetector being electrically connected in series with the combination of the waveguide electroabsorption modulator and the resistor;
at least one semiconductor laser located on the III-V compound semiconductor substrate to provide light which is transmitted through the waveguide electroabsorption modulator of each optical logic gate, with the transmitted light being from each optical logic gate being coupled into the waveguide photodetector of the other optical logic gate to latch the pair of optical logic gates and thereby store the bit of optical information therein; and
a plurality of optical waveguides located on the III-V compound semiconductor substrate to couple the transmitted light from the waveguide electroabsorption modulator of each optical logic gate to the waveguide photodetector of the other optical logic gate, to couple optical input signals into the waveguide photodetectors of the pair of optical logic gates to set and reset the bit of optical information stored in the optical data latch, and to couple the bit of optical information out of the optical data latch.

13. The optical data latch of claim 12 wherein the pair of optical logic gates are selected from the group consisting of optical NOT gates and optical NOR gates.

14. The optical data latch of claim 12 wherein each semiconductor laser is a distributed Bragg reflector (DBR) laser.

15. The optical data latch of claim 12 wherein the light provided by each semiconductor laser has a wavelength in the range of 0.8-2.0 microns.

16. The optical data latch of claim 12 further comprising a plurality of semiconductor optical amplifiers located on the III-V compound semiconductor substrate and optically connected to the plurality of optical waveguides.

17. The optical data latch of claim 12 wherein the III-V compound semiconductor substrate comprises indium phosphide or gallium arsenide.

18. The optical data latch of claim 12 wherein each waveguide photodetector and each waveguide electroabsorption modulator comprises a plurality of III-V compound semiconductor layers which are epitaxially grown on the III-V compound semiconductor substrate.

19. The optical data latch of claim 18 wherein the III-V compound semiconductor substrate comprises indium phosphide (InP), and the plurality of III-V compound semiconductor layers are selected from the group consisting of indium gallium arsenide phosphide (InGaAsP) layers, indium gallium arsenide (InGaAs) layers, indium aluminum gallium arsenide (InAlGaAs) layers, and combinations thereof.

20. The optical data latch of claim 18 wherein the III-V compound semiconductor substrate comprises gallium arsenide (GaAs), and the plurality of III-V compound semiconductor layers are selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

21. An optical data latch, comprising:
a III-V compound semiconductor substrate having a plurality of III-V compound semiconductor layers epitaxially grown thereon;
at least one semiconductor laser formed from the plurality of III-V compound semiconductor layers, with each semiconductor laser generating light in a wavelength range of 0.8-2.0 microns; and
a pair of optical logic gates formed from the plurality of III-V compound semiconductor layers, with each optical logic gate comprising a waveguide electroabsorption modulator which is electrically connected in series with a waveguide photodetector, and with the light being transmitted through the waveguide electroabsorption modulator in each optical logic gate forming an output for that optical logic gate, and with the output of each optical logic gate being coupled into the waveguide photodetector of the other optical logic gate of the pair of optical logic gates to latch the optical data latch and thereby store a bit of optical information in the optical data latch; and
a plurality of optical waveguides formed from the plurality of III-V compound semiconductor layers to couple the output of each optical logic gate into the waveguide photodetector of the other optical logic gate of the pair of optical logic gates, to couple an optical input signal into the waveguide photodetector of each optical logic gate to set or reset the bit of optical information stored in the optical data latch, and to couple the bit of optical information out of the optical data latch.

22. The optical data latch of claim 21 wherein the pair of optical logic gates are selected from the group consisting of optical NOT gates and optical NOR gates.

23. The optical data latch of claim 21 further comprising a resistor which is electrically connected in parallel with the waveguide electroabsorption modulator.

24. The optical data latch of claim 21 further comprising a semiconductor optical amplifier to amplify the light coupled into each waveguide photodetector.

25. The optical data latch of claim 21 wherein each semiconductor laser comprises a distributed Bragg reflector (DBR) laser.

26. The optical data latch of claim 21 wherein the III-V compound semiconductor substrate comprises indium phosphide (InP), and the plurality of III-V compound semiconductor layers are selected from the group consisting of indium gallium arsenide phosphide (InGaAsP) layers, indium gallium arsenide (InGaAs) layers, indium aluminum gallium arsenide (InAlGaAs) layers, and combinations thereof.

27. The optical data latch of claim 21 wherein the III-V compound semiconductor substrate comprises gallium arsenide (GaAs), and the plurality of III-V compound semiconductor layers are selected from the group consisting of GaAs layers, aluminum gallium arsenide (AlGaAs) layers, indium gallium arsenide phosphide (InGaAsP) layers, indium gallium arsenide (InGaAs) layers, and combinations thereof.

* * * * *

UNITED STATES PATENT AND TRADEMARK OFFICE
CERTIFICATE OF CORRECTION

PATENT NO. : 7,787,719 B1  
APPLICATION NO. : 12/558025  
DATED : August 31, 2010  
INVENTOR(S) : G. Allen Vawter Page 1 of 1

It is certified that error appears in the above-identified patent and that said Letters Patent is hereby corrected as shown below:

Title Page:
Item 73
The assignee name is printed on the issued patent as "Sardia Corporation" due to a printing error by the United States Patent and Trademark Office (USPTO). The spelling of the assignee name should be corrected to "Sandia Corporation" as correctly identified in the issue fee form. Because this is an error incurred through the fault of the USPTO, no fee is due according to MPEP § 1480.

Signed and Sealed this
Fifteenth Day of February, 2011

David J. Kappos
*Director of the United States Patent and Trademark Office*